United States Patent
Ano et al.

(10) Patent No.: US 12,285,818 B2
(45) Date of Patent: Apr. 29, 2025

(54) METHOD FOR PRODUCING METAL CYLINDER MATERIAL, AND BACKING JIG USED THEREIN

(71) Applicant: FURUYA METAL CO., LTD., Tokyo (JP)

(72) Inventors: Genki Ano, Tokyo (JP); Tomohiro Maruko, Tokyo (JP); Tomoaki Miyazawa, Tokyo (JP); Yuichi Iwamoto, Tokyo (JP)

(73) Assignee: FURUYA METAL CO., LTD., Tokyo (JP)

(*) Notice: Subject to any disclaimer, the term of this patent is extended or adjusted under 35 U.S.C. 154(b) by 527 days.

(21) Appl. No.: 17/636,378

(22) PCT Filed: Aug. 7, 2020

(86) PCT No.: PCT/JP2020/030370
§ 371 (c)(1),
(2) Date: Feb. 18, 2022

(87) PCT Pub. No.: WO2021/033580
PCT Pub. Date: Feb. 25, 2021

(65) Prior Publication Data
US 2022/0266376 A1      Aug. 25, 2022

(30) Foreign Application Priority Data
Aug. 22, 2019   (JP) .................................. 2019-152328

(51) Int. Cl.
*B23K 20/00*      (2006.01)
*B23K 20/12*      (2006.01)

(52) U.S. Cl.
CPC ................................ *B23K 20/126* (2013.01)

(58) Field of Classification Search
CPC .. B23K 20/129; B23K 20/122; B23K 20/126; B23K 20/128; B23K 20/1255; B23K 20/1245; B23K 2101/06; B23K 2101/12
See application file for complete search history.

(56) References Cited

U.S. PATENT DOCUMENTS

2002/0092890 A1*  7/2002  Ezumi ................ B23K 20/1265
                                                    228/2.1
2003/0192941 A1* 10/2003  Ishida .................. B23K 20/128
                                                    228/2.1
(Continued)

FOREIGN PATENT DOCUMENTS

CN    109366052 A    2/2019
JP    H0586462 A     4/1993
(Continued)

OTHER PUBLICATIONS

JP-2012076120-A English Machine Translation (Year: 2012).*
(Continued)

*Primary Examiner* — Erin B Saad
(74) *Attorney, Agent, or Firm* — Ohlandt, Greeley and Perle, L.L.P.

(57) ABSTRACT

A method for producing the metal cylinder material according to the present disclosure includes: a process A of forming a slitted cylinder-shaped body including at least one slit extending from one end face to the other end face of a cylinder barrel portion consisting of at least one metal plate material; a process B of forming a filler-equipped cylinder-shaped body including a filling portion obtained by filling the slit with a filler for the filler to be filled throughout the slit in a length direction of the slit; and a process C of, by inserting at least a probe of a friction stir rotation tool including the probe at least into the filling portion and executing FSP, reforming at least the filling portion of the (Continued)

filler-equipped cylinder-shaped body to obtain the metal cylinder material including an FSP portion.

14 Claims, 27 Drawing Sheets

(56) References Cited

U.S. PATENT DOCUMENTS

| | | |
|---|---|---|
| 2004/0041005 A1 | 3/2004 | Tanaka et al. |
| 2006/0207876 A1 | 9/2006 | Matsumura et al. |
| 2008/0099534 A1* | 5/2008 | Brice ................ B23K 20/126 228/112.1 |
| 2008/0277036 A1* | 11/2008 | Johansen ........... B23K 20/1225 148/698 |
| 2009/0068492 A1* | 3/2009 | Fujii .................. B23K 20/128 428/615 |
| 2009/0250144 A1* | 10/2009 | Kumagai ............. B23K 20/24 228/112.1 |
| 2010/0101768 A1* | 4/2010 | Seo ................... B23K 20/1225 29/890.038 |
| 2012/0315399 A1* | 12/2012 | Feng ................. C22C 32/0063 427/292 |
| 2012/0325380 A1* | 12/2012 | Kamoshida ........ B23K 20/1255 148/400 |
| 2013/0299561 A1* | 11/2013 | Higgins ............. B23K 20/129 228/205 |
| 2014/0217154 A1* | 8/2014 | Obaditch ............ B23K 20/126 228/2.1 |
| 2015/0007912 A1* | 1/2015 | Fujii .................. B23K 20/122 148/508 |
| 2016/0008918 A1* | 1/2016 | Burford ............ B23K 20/1255 228/2.1 |
| 2016/0033059 A1* | 2/2016 | Fonte ................. B23K 31/027 219/121.64 |
| 2016/0136703 A1* | 5/2016 | Stäubli ................ B21B 15/0085 72/203 |
| 2016/0151855 A1* | 6/2016 | Fukuda ................ B23K 20/122 228/114.5 |
| 2019/0076957 A1* | 3/2019 | Severson ........... B23K 20/1225 |
| 2019/0283174 A1* | 9/2019 | Onose ................ B23K 20/1265 |
| 2021/0239271 A1* | 8/2021 | Bogachek ................ F16J 12/00 |
| 2021/0291293 A1* | 9/2021 | Cheng ....................... B23P 6/00 |
| 2022/0266376 A1* | 8/2022 | Ano .......................... C23C 14/34 |

FOREIGN PATENT DOCUMENTS

| | | | |
|---|---|---|---|
| JP | H05230645 A | | 9/1993 |
| JP | 2003094177 A | | 4/2003 |
| JP | 2004-195480 A | | 7/2004 |
| JP | 2012076120 A | * | 4/2012 |
| JP | 2015120975 A | | 7/2015 |
| JP | 2018-020365 A | | 2/2018 |
| WO | 2004090194 A1 | | 10/2004 |
| WO | 2018025497 A1 | | 2/2018 |

OTHER PUBLICATIONS

JP-2015120975 computer english translation (Year: 2024).*
Korean Office Action dated Nov. 25, 2023 for Korean Appl. No. 10-2022-7009139.
International Search Report dated Nov. 10, 2020 for PCT Appl. No. PCT/JP2020/03070.
Japanese Office Action dated Nov. 13, 2019 for Japanese Appl. No. 2019-152328.
International Preliminary Report on Patentability (with English translation) dated Mar. 3, 2022 for PCT Appl. No. PCT/JP2020/03070.
Chinese Office Action dated Aug. 8, 2023 for Chinese Appl. No. 2020-80058928.9.

* cited by examiner

METHOD FOR PRODUCING METAL CYLINDER MATERIAL, AND BACKING JIG USED THEREIN

TECHNICAL FIELD

The present disclosure relates to a method for producing a metal cylinder material using a friction stir process and a jig used for the method for producing the same, for example the present disclosure relates to a method for producing a large circular cylinder-type sputtering target using metal material reforming by the friction stir process and a backing jig used for the method for producing the same.

Background Art

A circular cylinder-type sputtering target (hereinafter referred to as circular cylinder target) is conventionally known to be more efficient to use than a plane-type sputtering target that has been the mainstream (hereinafter referred to as plate target), and to contribute greatly to running cost reduction. In addition, since the cathode structure is a circular cylinder, which provides excellent cooling performance and allows spatial distribution of magnetic field lines to be freely adjusted, plasma optimization has become easier, and there is a growing need for use in the formation of reflective films for organic EL displays and lighting, where reducing the heat load on a substrate is important. As this reflective films for organic EL displays and lighting, Al reflective films or Ag reflective films advantageous for high luminance and high efficiency are used.

Due to the demand for large displays, the circular cylinder target is also becoming larger and larger, and for example, a large circular cylinder target with a diameter of 0.2 m and a length of 2 m is beginning to be used.

In that connection, the method for producing the circular cylinder target is vastly different from the method for producing conventional plate targets. For example, a method for filling the outer circumference of a circular cylinder-shaped base with powder and forming the circular cylinder target by hot isostatic pressing (HIP) is described (see, for example, Patent Literature 1). In addition, a method for forming a target layer on the outer circumferential surface of a circular cylinder-shaped base by a thermal spraying method is described (see, for example, Patent Literature 2).

In addition, a technique for producing a plate target by joining is proposed (see, for example, Patent Literature 3 or Patent Literature 4). In particular, it is claimed that the size of a crystal grain obtained by friction stir welding (hereinafter referred to as FSW), which is one type of solid-state joining method, is comparable to that of melt welding between the joint portion and base material portion (see, for example, Patent Literature 4). In addition, since melt welding of materials with high thermal conductivity, such as Au, Cu, Al, and Ag, is extremely difficult and requires a large facility, joining the materials by FSW has the advantage of being more effective and not requiring a large facility.

Regarding FSW of a cylinder, the production method of rounding an aluminum plate material, flattening a butt portion, executing FSW, and forming the flattened butt portion into a circular arc after completion of FSW is described (see, for example, Patent Literature 5).

CITATION LIST

Patent Literature

Patent Literature 1: Japanese Patent Application Laid-Open No. H5-230645

Patent Literature 2: Japanese Patent Application Laid-Open No. H5-86462

Patent Literature 3: Japanese Patent Application Laid-Open No. 2015-120975

Patent Literature 4: WO No. 2004/090194

Patent Literature 5: Japanese Patent Application Laid-Open No. 2003-94177

SUMMARY OF INVENTION

Technical Problem

However, by the production method described in Patent Literature 1, as the circular cylinder target becomes larger, production by HIP is constrained more by the larger size of the facility. By the production method described in Patent Literature 2, for materials with high thermal conductivity, such as Al and Ag, the production by thermal spraying has a problem of pores generated in the target layer and a problem of the target layer peeling off. Furthermore, production by thermal spraying causes a problem that the target material is easily oxidized.

Of course, there is also a method for producing an integral-type circular cylinder target by using a large facility. As the method, a columnar billet is prepared by melting, and a hollow tube is fabricated by deep hole drilling and piercing. After that, the hollow tube is formed into a desired size by drawing. However, since the product weight is about ½ to ⅓ of the prepared billet, the yield is poor and the production cost is huge accordingly. In addition, since strong processing on a 30 to 50 mm thick circular cylinder may cause cracks depending on the material, and there are production risks such as lot out.

In addition, by the production method described in Patent Literature 5, it is difficult to align both ends of a plate material to the same height and butt the ends in a flat line to make a butt portion. Furthermore, the plate thickness is thin, about 3 mm, and the plate width is very short, equal to or less than 400 mm.

For example, if FSW is used to produce a large circular cylinder target with a diameter of 0.2 m, a length of 2 m, and a wall thickness of 10 mm, in fact, this butt portion is very difficult to form. Even if a rectangular plate material is rounded, the butt portion does not become an I-shaped groove due to the compression of the inside diameter and the tension of the outside diameter. In addition, because the target is long, 2 m, the influence of springback is noticeable, and both ends in the longitudinal direction have less internal stress and are easily rounded, but since the internal stress is large in the central portion, the butt portion opens. Although it is possible to make some corrections, there will be a discrepancy in the end faces of the plate material in the butt portion. There is also a method for cutting the ends of the plate material after rounding and making the butt portion an I-shaped groove, but since the shape is a circular cylinder, it is necessary to estimate the butt state and apply edge preparation to the end. Therefore, it is very difficult to butt the ends with high accuracy, and it requires a lot of cost and time to process in advance.

In this way, although the circular cylinder target is very attractive for high usage efficiency and reduction in heat load on the substrate, there is little literature on the method for producing good quality circular cylinder targets, and at present, there are still problems with huge production costs and production instability.

The present disclosure has been made against the background of such circumstances, and an object of the present disclosure is to provide a method for easily producing a metal cylinder material having excellent quality at lower costs. More specifically, it is an object of the present disclosure to provide an integral-type high-quality metal cylinder material by reforming, without being affected by the compression of the inside diameter and the tension of the outside diameter occurred in forming a cylinder shape by using a metal plate material, affected by processing difficulty in the longitudinal direction of the cylinder shape, and affected by processing accuracy of end faces of the metal plate material to be butted.

Solution to Problem

As a result of diligent studies to achieve the object, it has been found out that the above-described problems can be solved by causing the end faces of the plate material to face each other without touching, filling the slit, which is a gap existing between the end faces, with the filler without adjusting the shape of the end faces of the plate material, and reforming a filling portion by friction stir processing (FSP) by using the friction stir technology, and the present invention has been completed.

A method for producing a metal cylinder material according to the present invention includes: a process A of forming a slitted cylinder-shaped body including at least one slit extending from one end face to the other end face of a cylinder barrel portion consisting of at least one metal plate material; a process B of forming a filler-equipped cylinder-shaped body including a filling portion obtained by filling the slit with a filler for the filler to be filled throughout the slit in a length direction of the slit; and a process C of, by inserting at least a probe of a friction stir rotation tool including the probe into at least the filling portion and executing FSP, reforming at least the filling portion of the filler-equipped cylinder-shaped body to obtain the metal cylinder material including an FSP portion.

In the method for producing the metal cylinder material according to the present invention, preferably, the friction stir rotation tool further includes a shoulder portion, and the reforming in the process C includes, when moving the friction stir rotation tool in one direction along the length direction of the slit while rotating, forming a plastic area protruding, from a filling portion around the shoulder portion and the probe, of the filling portion, over both sides of the metal plate material sandwiching the filling portion, applying shearing force in a rotational direction of the friction stir rotation tool to a plastic fluid in the plastic area to remove a defect and a void included in the plastic fluid, and furthermore, after the friction stir rotation tool has passed, obtaining the solid FSP portion by the plastic fluid being cooled and solidified. By executing single FSP in which the friction stir rotation tool passes through the slit in the length direction thereof once, the process from the formation of the plastic fluid to the completion of the solid FSP portion is performed, making it possible to efficiently obtain the metal cylinder material. In addition, the plastic area can be stirred more integrally.

In the method for producing the metal cylinder material according to the present invention, the slitted cylinder-shaped body may have a shape of one metal plate material rounded into a cylinder shape, with the slit being a gap between the end faces, opposite each other with a space, of the metal plate material, or have a shape of one cylinder shape formed by combining two or more metal plate materials, with the slit being a gap between the end faces, opposite each other with a space, of adjacent metal plate materials of the metal plate materials. For one or a plurality of metal plate materials, the slitted cylinder-shaped body can be formed.

In the method for producing the metal cylinder material according to the present invention, preferably, the slitted cylinder-shaped body is a slitted circular cylinder-shaped body, and a width of the slit is 0.2 mm or more and less than $0.4 \times (2d_o-1)^{1/2}$ mm (note that $d_o$ indicates an outside diameter (unit: mm) of the slitted circular cylinder-shaped body), or the slitted cylinder-shaped body is a slitted elliptical cylinder-shaped body, and a width of the slit is 0.2 mm or more and less than $0.4 \times (2d_o-1)^{1/2}$ mm (note that $d_o$ indicates an outside diameter (unit: mm) of a short axis direction of the slitted elliptical cylinder-shaped body). It is possible to make it easier to fill the slit with the filler, and to allow the reforming of the filling portion to be performed more efficiently.

In the method for producing the metal cylinder material according to the present invention, preferably, the process B is either one of a process B1 of overlaying the filler in the slit by an MIG or TIG method, a process B2 of pouring a molten body into the slit, a process B3 of fitting a block material having a thickness equal to or greater than a wall thickness of the metal plate material into the slit, and pressing with a friction stir rotation tool with no probe, or a process B4 of installing at least one of a wire, a granule, and powder in the slit, and pressing with a hammer, a press, or a friction stir rotation tool with no probe. It is possible to fill the slit with the filler more efficiently In the method for producing the metal cylinder material according to the present invention, preferably, a thickness of the filler is thicker than the wall thickness of the metal plate material. In the process C, it is possible to make it easier to remove defects and voids included in the plastic fluid.

In the method for producing the metal cylinder material according to the present invention, preferably, an apparent volume of the filler is greater than a volume of the slit. In the process C, it is possible to make it easier to remove defects and voids included in the plastic fluid.

In the method for producing the metal cylinder material according to the present invention, preferably, in the process B1 or the process B2, a backing jig including a backing portion is installed in an inside of the slitted cylinder-shaped body. It is possible to prevent the filler from being overlaid in the inside of the slitted cylinder-shaped body or to prevent the molten body from flowing down from the slit.

In the method for producing the metal cylinder material according to the present invention, preferably, in the process B3, a backing jig including a backing portion is installed in an inside of the slitted cylinder-shaped body, the slitted cylinder-shaped body is gripped, the slitted cylinder-shaped body is pressed from an outer circumferential surface side toward the backing portion by the friction stir rotation tool with no probe, or in the process B4, a backing jig including a backing portion is installed in an inside of the slitted cylinder-shaped body, the slitted cylinder-shaped body is gripped, and the slitted cylinder-shaped body is pressed from an outer circumferential surface side toward the backing portion by the hammer, the press, or the friction stir rotation tool with no probe. It is possible to fill the slit with the filler more tightly.

In the method for producing the metal cylinder material according to the present invention, preferably, in the process C, when the wall thickness of the metal plate material is $T_1$ (unit: mm), a probe length $Q_1$ (unit: mm) of the friction stir rotation tool satisfies $0<Q_1\leq(T_1-0.5)$. It is possible to prevent the probe of the friction stir rotation tool from penetrating the filling portion.

In the method for producing the metal cylinder material according to the present invention, preferably, in the process C, a backing jig including a backing portion is installed in an inside of the filler-equipped cylinder-shaped body, the filler-equipped cylinder-shaped body is gripped, the friction stir rotation tool is inserted into the filler-equipped cylinder-shaped body from an outer circumferential surface side toward the backing portion, and at least the filling portion of the filler-equipped cylinder-shaped body is reformed. It is possible to achieve higher quality reforming with no space or defect inside the FSP portion.

In the method for producing the metal cylinder material according to the present invention, preferably, a wall thickness $T_A$ of a place of the metal cylinder material other than the FSP portion is 2 mm or more and 25 mm or less, and a length $L_1$ of the metal cylinder material is 500 mm or more. Even if the metal cylinder material is long, production is possible without using a large facility.

The method for producing the metal cylinder material according to the present invention preferably further includes a process D of applying plastic working to at least the FSP portion of the metal cylinder material after the process C. By adding a working distortion by the plastic working, it is possible to adjust the crystal grains and improve the uniformity of the crystal grains size between the FSP portion and the cylinder barrel portion, and it is possible to produce the metal cylinder material with high dimensional accuracy.

The method for producing the metal cylinder material according to the present invention preferably further includes, between the process C and the process D, after the process D, or both between the process C and the process D and after the process D, a process E of performing heat treatment on the metal cylinder material at a temperature equal to or higher than a recrystallization temperature of the metal plate material. It is possible to reduce the internal stress of the metal cylinder material and improve the uniformity of the size of the crystal grains in the FSP portion and the cylinder barrel portion.

In the method for producing the metal cylinder material according to the present invention, preferably, the metal cylinder material includes either one of Au, Ag, Al, Cu, Zn, Au-base alloy, Ag-base alloy, Al-base alloy, Cu-base alloy, or Zn-base alloy. The metal cylinder material can be produced even with a material that has high thermal conductivity and/or is easily oxidized.

In the method for producing the metal cylinder material according to the present invention, preferably, the metal cylinder material is an entire or part of a sputtering target, a pressure vessel capsule, or a pressure vessel liner. Using these devices or components can implement convenience, low cost, and high quality.

A backing jig according to the present invention is the backing jig used in the method for producing the metal cylinder material according to the present invention, the backing jig is installable in the inside of the filler-equipped cylinder-shaped body, the backing jig includes the backing portion and a leg portion located on a rear side of a front surface of the backing portion, when installed in the inside of the filler-equipped cylinder-shaped body, the front surface of the backing portion faces an inner surface of the filling portion, and a front surface of the leg portion is in contact with an inner surface of the cylinder barrel portion, in a state where the filler-equipped cylinder-shaped body is a filler-equipped circular cylinder-shaped body, the cylinder barrel portion is a circular cylinder barrel portion, and the backing jig is installed in an inside of the filler-equipped circular cylinder-shaped body, a minimum distance G (unit: mm) between a temporary line connecting straight both ends of the slit on an inner surface side of the circular cylinder barrel portion, appearing in a cross section perpendicularly crossing an axis of the filler-equipped circular cylinder-shaped body, and the front surface of the backing portion satisfies $0\leq G\leq 0.1 d_i$ (note that $d_i$ indicates an inside diameter (unit: mm) of the filler-equipped circular cylinder-shaped body), or in a state where the filler-equipped cylinder-shaped body is a filler-equipped elliptical cylinder-shaped body, the cylinder barrel portion is an elliptical cylinder barrel portion, and the backing jig is installed in an inside of the filler-equipped elliptical cylinder-shaped body, a minimum distance G (unit: mm) between a temporary line connecting straight both ends of the slit on an inner surface side of the elliptical cylinder barrel portion, appearing in a cross section perpendicularly crossing an axis of the filler-equipped elliptical cylinder-shaped body, and the front surface of the backing portion satisfies $0\leq G\leq 0.1 d_i$ (note that $d_i$ indicates an inside diameter (unit: mm) in a short axis direction of the filler-equipped elliptical cylinder-shaped body).

A backing jig according to the present invention is the backing jig that is used in the method for producing the metal cylinder material according to the present invention, and includes: the backing portion; a leg portion located on a rear side of a front surface of the backing portion; and a variable mechanism that changes a length between the front surface of the backing portion and a front surface of the leg portion.

Advantageous Effects of Invention

The present disclosure can provide a method for easily producing a metal cylinder material having excellent quality at lower costs. More specifically, it is possible to provide an integral-type high-quality metal cylinder material by reforming, without being affected by the compression of the inside diameter and the tension of the outside diameter occurred in forming a cylinder shape by using a metal plate material, affected by processing difficulty in the longitudinal direction of the cylinder shape, and affected by processing accuracy of end faces of the metal plate material to be butted.

DESCRIPTION OF EMBODIMENT

Figure 1:
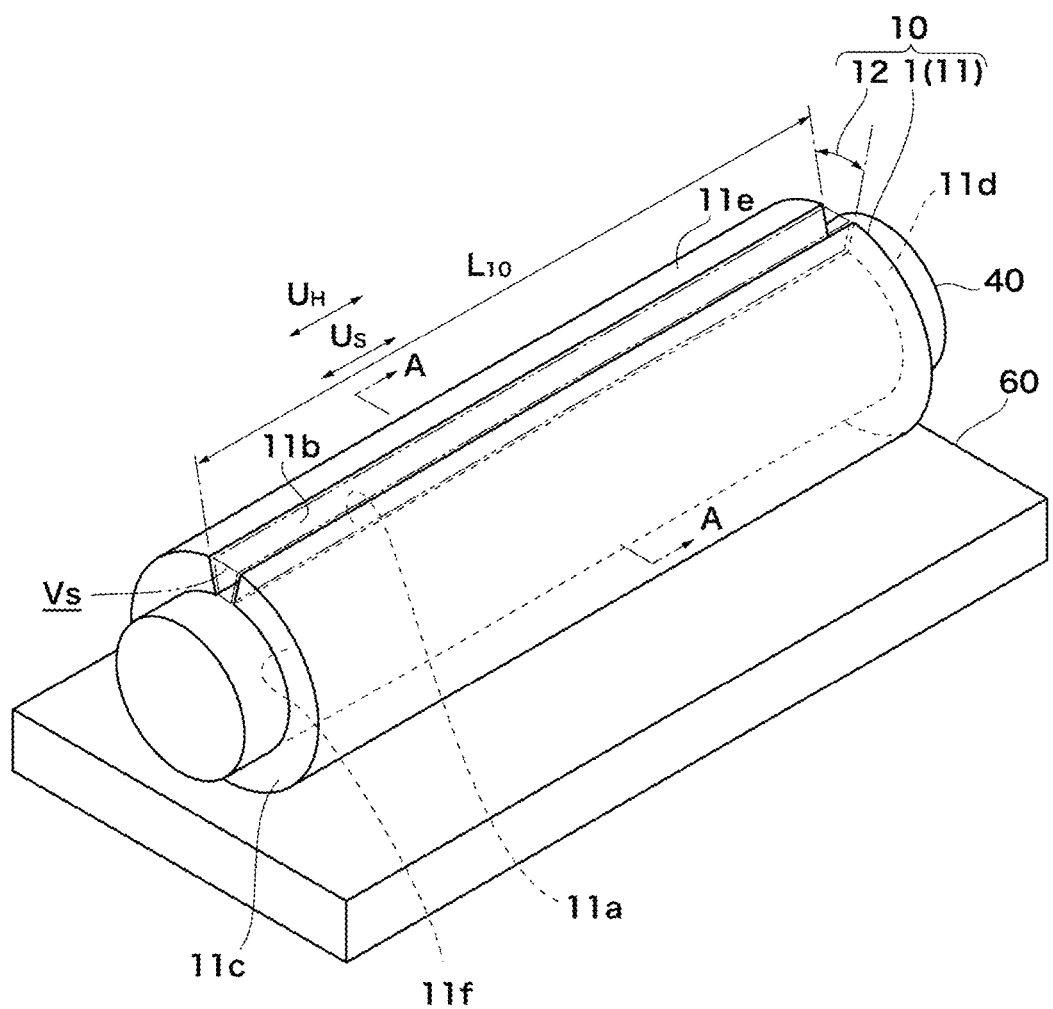
FIG. 1 is a perspective view showing a first form of a slitted circular cylinder-shaped body in a process A.

Hereinafter, the present invention will be described in detail by showing an embodiment with reference to the drawings, but the present invention is not construed as being limited to these descriptions. The embodiment may be modified in various ways as long as effects of the present invention are exhibited. Note that in the present specification and the drawings, it is assumed that components having the same reference symbol indicate the same component.

[First Form]

To begin with, about a method for producing a metal cylinder material, a first form in which a slitted cylinder-shaped body has a shape of one metal plate material cylindrically rounded into a cylinder shape and a backing jig of a columnar body is used will be described in detail.

A method for producing a metal cylinder material according to the present embodiment includes, as shown in FIGS. 1 to 7: a process A of forming a slitted cylinder-shaped body including at least one slit 12 extending from one end face 11c to the other end face 11d of a cylinder barrel portion consisting of at least one metal plate material 1; a process B of forming a filler-equipped cylinder-shaped body including a filling portion 22 obtained by filling the slit 12 with a filler 2 for the filler 2 to be filled throughout the slit in a length direction $U_S$ of the slit 12; and a process C of, by inserting at least a probe 53 of a friction stir rotation tool 50 including the probe 53 into at least the filling portion 22 and executing FSP, reforming at least the filling portion 22 of the filler-equipped cylinder-shaped body to obtain the metal cylinder material including an FSP portion 32.

The cylinder-shaped body includes, for example, a circular cylinder-shaped body and elliptical cylinder-shaped body. The present embodiment describes the circular cylinder-shaped body as a representative example. The metal cylinder material includes, for example, a metal circular cylinder material and metal elliptical cylinder material. The present embodiment describes the metal circular cylinder material as a representative example. In the following description, unless otherwise specified, the present embodiment also applies to the case where the cylinder-shaped body is an elliptical cylinder-shaped body and the case where the metal cylinder material is a metal elliptical cylinder material.

(Process A)

In the process A, as shown in FIG. 1, to begin with, one metal plate material 1 is prepared. The metal plate material 1 is, for example, a plate material made of metal or alloy in which an appearance shape of the plate surface is a shape obtained by developing a side surface of a column. A first end face 11a of the metal plate material 1 and a second end face 11b that does not share corners are preferably finished surfaces, but do not necessarily have to be finished surfaces because the end faces will be modified by reforming in the process C.

The composition of the metal plate material 1 is, for example, Au, Ag, Al, Cu, Zn, or an alloy containing these metals. The metal plate material 1 preferably contains any one of Au, Ag, Al, Cu, Zn, Au-base alloy, Ag-base alloy, Al-base alloy, Cu-base alloy, or Zn-base alloy. Preferred specific examples of the Au-base alloy include, for example, Au—Ag alloy, Au—Pd alloy, Au—Al alloy, Au—Cu alloy, Au—Zn alloy, Au—Sn alloy, Au—Ni alloy, and the like. Preferred specific examples of the Ag-base alloy include, for example, Ag—Au alloy, Ag—Al alloy, Ag—Cu alloy, Ag—Zn alloy, Ag—Pd alloy, Ag—Cu—Pd alloy, Ag—Cu—Pd—Ge alloy, Ag—In alloy, Ag—Bi alloy, and the like. Preferred specific examples of the Al-base alloy include, for example, Al—Au alloy, Al—Ag alloy, Al—Cu alloy, Al—Zn alloy, Al—Sc alloy, Al—Ti alloy, Al—Y alloy, Al—Zr alloy, Al—Hf alloy, Al—Nd alloy, Al—Si alloy, and the like. Preferred specific examples of the Cu-base alloy include Cu—Au alloy, Cu—Ag alloy, Cu—Al alloy, Cu—Zn alloy, Cu—Ga alloy, Cu—Ta alloy, Cu—Cr alloy, and the like. Preferred specific examples of the Zn-base alloy include Zn—Au alloy, Zn—Ag alloy, Zn—Al alloy, Zn—Cu alloy, Zn—Fe alloy, and the like. Here, when written as "$M_1$-$M_2$ alloy" (note that $M_1$ and $M_2$ mean metal elements), $M_1$ means a primary component and $M_2$ means a secondary component. The "$M_1$-$M_2$ alloy" means that a secondary component or additive component other than $M_2$ may be contained. The primary component means that $M_1$ has the maximum % by atom in the alloy. $M_2$ indicates the first secondary component, meaning that $M_2$ has the maximum % by atom in the alloy except $M_1$. The additive component means, for example, a contained element having content of 1% by atom or less. Note that for the Ag—Cu—Pd—Ge alloy, Ag corresponds to $M_1$ and Cu, Pd, and Ge correspond to $M_2$, and includes, for example, a silver alloy disclosed in WO 2005/031016.

The shape of the plate surface of the metal plate material 1 is preferably a parallelogram, rhombus, rectangle, or square in order to form a circular cylindrical shape, and is more preferably a rectangle or square. Hereinafter, unless otherwise specified, the case where the shape of the plate surface of the metal plate material 1 is a rectangle will be described as an example.

When the wall thickness of the metal plate material 1 is $T_1$ (unit: mm), $T_1$ is preferably 2 mm or more and 25 mm or less. Depending on the length and diameter of a slitted circular cylinder-shaped body 10 to form, $T_1$ can be adjusted.

Figure 2:
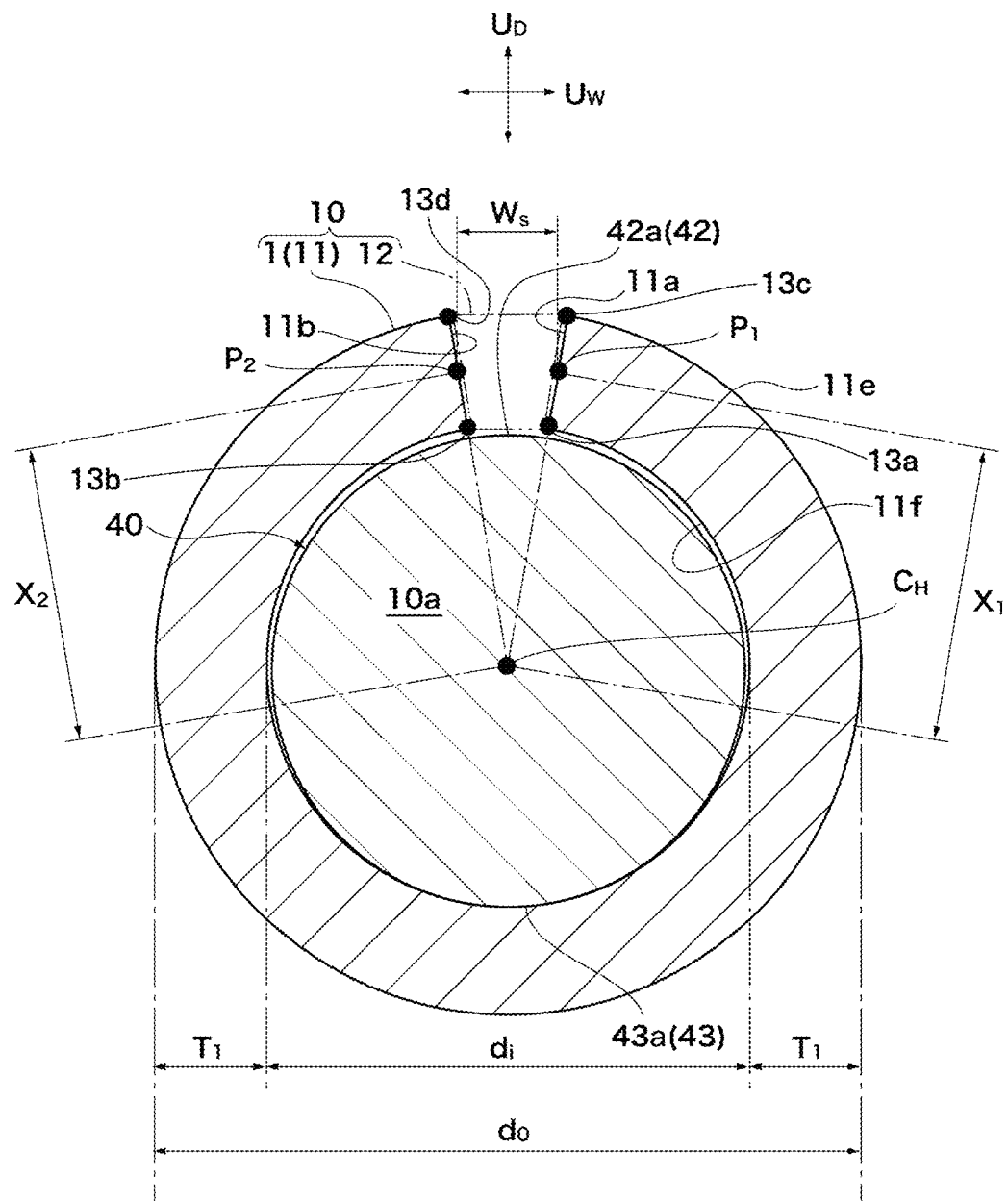
FIG. 2 is a cross-sectional view taken along a line A-A with a table omitted.

As shown in FIGS. 1 and 2, the metal plate material 1 is rounded by bending until the first end face 11a and the second end face 11b face each other with a space of length $W_S$ such that the entire metal plate material 1 forms part of a circular cylindrical shape, to form the slitted circular cylinder-shaped body 10.

With a space means not butting the first end face 11a and the second end face 11b. When the first end face 11a and the second end face 11b face each other with a space, the first end face 11a and the second end face 11b may face each other at an angle or face each other straight ahead.

In the form in which the first end face 11a and the second end face 11b face each other at an angle, for example, the metal plate material 1 shown in FIGS. 1 and 2 forms a circular cylinder barrel portion 11, but forms a rectangular parallelepiped before being rounded. When the thick metal plate material 1 is rounded, the side of an inner surface 11f of the circular cylinder barrel portion 11 of the slitted circular cylinder-shaped body 10 is compressed and the side of an outer circumferential surface 11e is pulled, and therefore the first end face 11a and the second end face 11b face each other at an angle.

The length $W_S$ (unit: mm) of the space in such a form is determined as follows. In FIG. 2, it is assumed that an arbitrary point on the first end face 11a is $P_i$, and that the center of the slitted circular cylinder-shaped body 10 is $C_H$. In addition, it is assumed that the inside diameter of the slitted circular cylinder-shaped body 10 is $d_i$ (unit: mm), and that the outside diameter of the slitted circular cylinder-shaped body 10 is $d_o$ (unit: mm). Furthermore, it is assumed that the point on the second end face 11b, with the distance $X_2$ from $C_H$ ($d_i/2 \le X_2 = d_o/2$) to the point equal to the length $X_1$ of the line segment $P_1 C_H$, is $P_2$. The space length $W_S$ is the length of the line segment $P_1 P_2$. $W_S$ decreases toward the inner surface 11f of the slitted circular cylinder-shaped body 10. The case where the slitted cylinder-shaped body is a slitted circular cylinder-shaped body has been described above, but when the slitted cylinder-shaped body is a slitted elliptical cylinder-shaped body, it is assumed that the intersection of the short axis and the long axis is $C_H$. In addition, it is assumed that twice the shortest distance between a temporary line connecting straight both ends (13a, 13b) of the slit on the inner surface side of the elliptical cylinder barrel portion, appearing in a cross section perpendicularly crossing the axis of the slitted elliptical cylinder-shaped body, and the intersection $C_H$ is $d_i$ (unit: mm). Furthermore, it is assumed that twice the shortest distance between a temporary line connecting straight both ends (13c, 13d) of the slit on the outer circumferential surface side of the elliptical cylinder barrel portion, appearing in the cross section perpendicularly crossing the axis of the slitted elliptical cylinder-shaped body, and the intersection $C_H$ is $d_o$ (unit: mm).

The form in which the first end face 11a and the second end face 11b face each other straight ahead is, for example: the form in which, when preparing the metal plate material 1, after making the first end face 11a and the second end face 11b inclined, the metal plate material 1 is rounded such that the first end face 11a and the second end face 11b face each other straight ahead: or the form in which, after the metal plate material 1 is rounded, the first end face 11a and the second end face 11b are machined such that the first end face 11a and the second end face 11b face each other straight ahead. At this time, the space length $W_S$ is constant regardless of the position of the point $P_i$ in FIG. 2.

The space length $W_S$ is preferably 0.2 mm or more and less than $0.4 \times (2d_o-1)^{1/2}$ mm. This makes it easier to fill the slit 12 with the filler 2, and the filling portion 22 can be reformed more efficiently. If $W_S$ is less than 0.2 mm, it may be difficult to fill the slit 12 with the filler 2, and if $W_S$ is $0.4 \times (2d_o-1)^{1/2}$ mm or more, the time and effort for reforming the filling portion 22 may increase. The case where the slitted cylinder-shaped body is a slitted circular cylinder-shaped body has been described above, but when the slitted cylinder-shaped body is a slitted elliptical cylinder-shaped body, it is assumed that the outside diameter of the short axis direction of the slitted elliptical cylinder-shaped body is $d_o$ (unit: mm).

Bending is, for example, bending with a bender, rolling bending, press working, or bending by drawing.

The slitted circular cylinder-shaped body 10 includes, as shown in FIG. 1, the circular cylinder barrel portion 11 consisting of one metal plate material 1, and at least one slit 12 extending from one end face 11c to the other end face 11d of the circular cylinder barrel portion 11. The slitted circular cylinder-shaped body 10, which includes the slit 12, is not perfectly circular cylinder-shaped. The inner surface 11f and the outer circumferential surface 11e of the circular cylinder barrel portion 11 are arc surfaces. The slit 12 is a gap between the first end face 11a and the second end face 11b facing each other with a space of the metal plate material 1. The width of the slit 12 is the length $W_S$ of the space.

The appearance of the slit 12 is, for example, linear or curved, and preferably linear as shown in FIG. 1 from the viewpoint of simplifying the operation in the process B and the process C.

The length direction $U_S$ of the slit 12 may be angled with respect to the length direction $U_H$ of the circular cylinder barrel portion 11, but preferably agrees with the length direction $U_H$ of the circular cylinder barrel portion 11. This can facilitate the operation in the process B and the process C. In FIG. 1, to cause the direction $U_S$ to agree with the direction $U_H$, when bending, the metal plate material 1 is bent such that one end face 11c is in contact with one plane and the other end face 11d is in contact with another plane parallel to the plane, but the metal plate material 1 is bent in the same way even if the metal plate material 1 is a square. When the direction $U_S$ is angled with respect to the direction $U_H$, the metal plate material 1 is, for example, a parallelogram or rhombus.

As shown in FIG. 1, when the length of the slitted circular cylinder-shaped body 10 is $L_{10}$ (unit: mm), $L_{10}$ is preferably 500 mm or more. The length $L_1$ (unit: mm) of a metal circular cylinder material 30 can be 500 mm or more.

The outside diameter $d_o$ of the slitted circular cylinder-shaped body 10 as shown in FIG. 2 preferably satisfies 100 mm or more and 300 mm or less. The inside diameter $d_i$ of the slitted circular cylinder-shaped body 10 preferably satisfies 50 mm or more and 296 mm or less. The case where the slitted cylinder-shaped body is a slitted circular cylinder-shaped body has been described above, but when the slitted cylinder-shaped body is a slitted elliptical cylinder-shaped body, the outside diameter $d_o$ of the short axis direction of the slitted elliptical cylinder-shaped body preferably satisfies 100 mm or more and 300 mm or less. In addition, the inside diameter $d_i$ of the short axis direction of the slitted elliptical cylinder-shaped body preferably satisfies 50 mm or more and 296 mm or less.

(Process B)

In starting the process B, as shown in FIGS. 1 and 2, the slitted circular cylinder-shaped body 10 is placed on a table 60, and a backing jig 40 of a columnar body is inserted into an inside 10a of the slitted circular cylinder-shaped body 10 and installed. The backing jig 40 includes a backing portion 42 and a leg portion 43 located on the rear side of a front surface 42a of the backing portion 42. The front surface 42a is part of the outer circumferential surface of the backing jig 40. The backing jig 40 preferably includes a steel material or a ceramic material such as silicon nitride. The case where the slitted cylinder-shaped body is a slitted circular cylinder-shaped body has been described above, but when the slitted cylinder-shaped body is a slitted elliptical cylinder-shaped body, a backing jig of an elliptical columnar body may be used.

Figure 3:
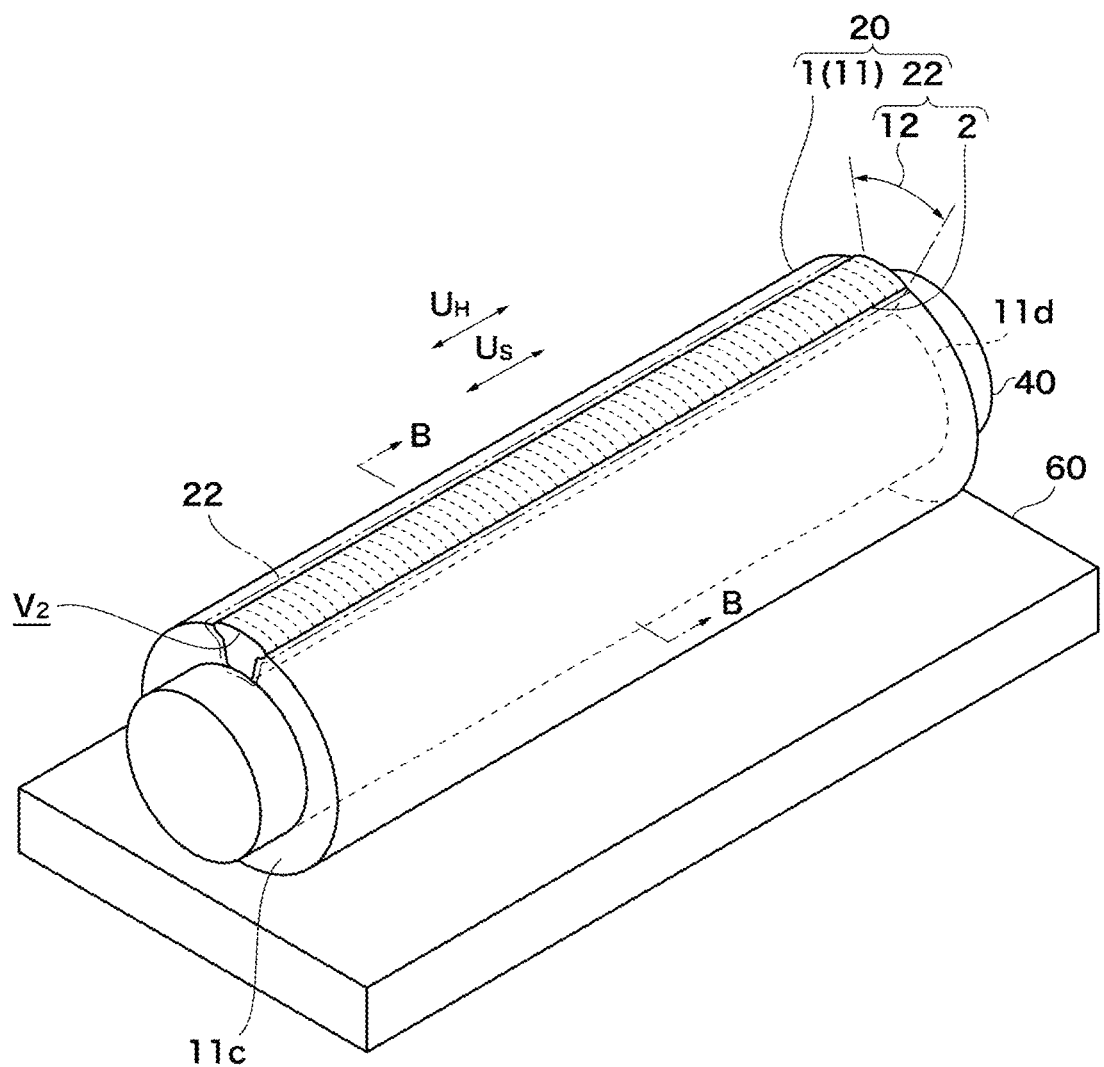
FIG. 3 is a perspective view showing the first form of a filler-equipped circular cylinder-shaped body in a process B.
Figure 4:
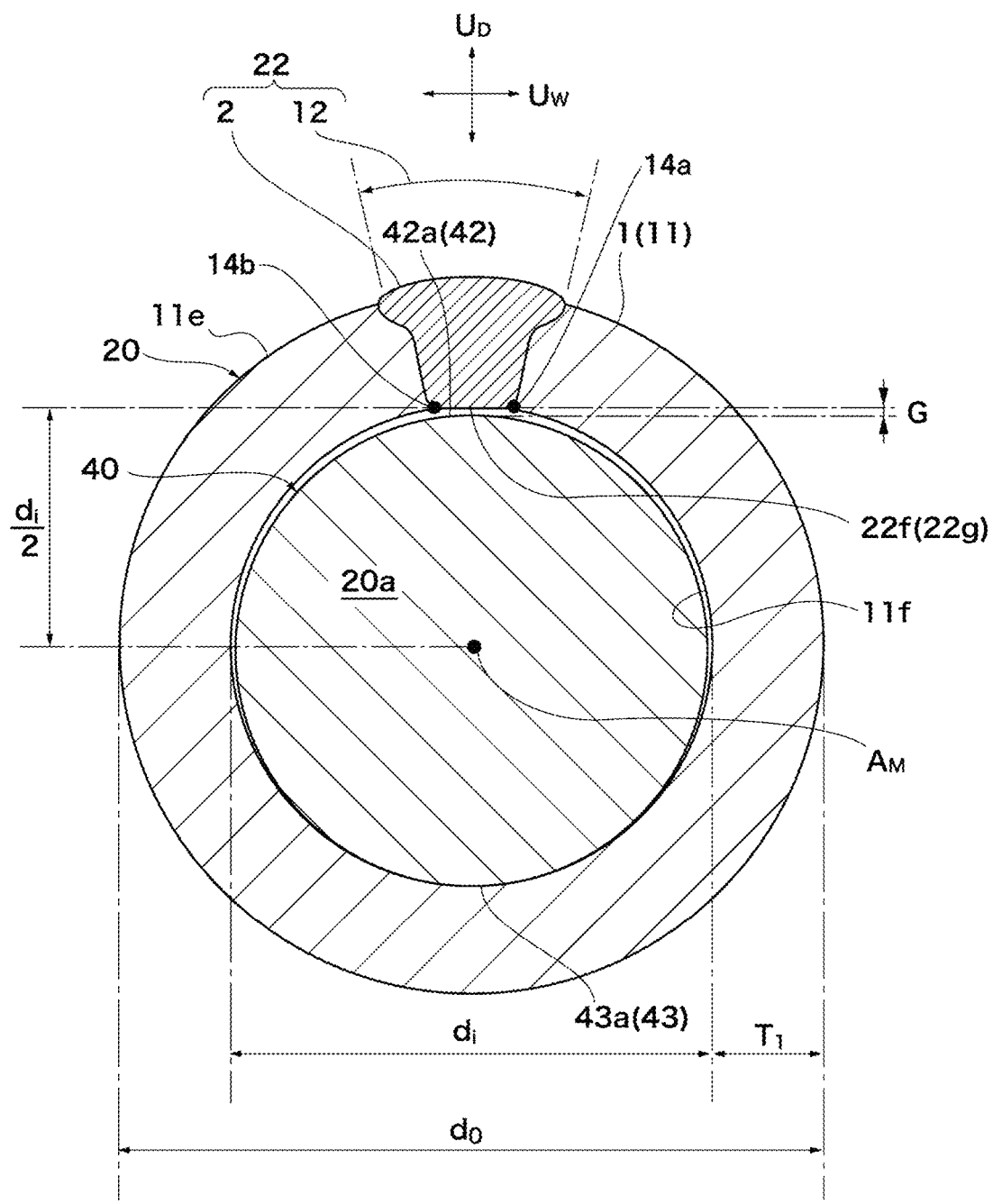
FIG. 4 is a cross-sectional view taken along a line B-B with a table omitted.

In the process B, as shown in FIGS. 3 and 4, the slit 12 is filled with the filler 2 for the filler 2 to be filled throughout the slit 12 in a direction $U_S$ of the slit 12 to form a filler-equipped circular cylinder-shaped body 20. Here, the front surface 42a of the backing portion 42 faces the inner surface 22f of the filling portion 22, and the front surface 43a of the leg portion 43 is in contact with the inner surface 11f of the circular cylinder barrel portion 11. The front surface 43a of the leg portion 43 forms part of the outer circumferential surface of the backing jig 40. When the inside diameter of the filler-equipped circular cylinder-shaped body 20 is $d_i$ (unit: mm), the shortest distance G (unit: mm) between the front surface 42a of the backing portion 42 and a temporary line 22g satisfies $0 \leq G \leq 0.1 d_i$. Here, the temporary line 22g is a temporary line connecting straight both ends 14a and 14b of the slit 12 on the inner surface 11f side of the circular cylinder barrel portion 11 appearing in a cross section perpendicularly crossing an axis $A_M$ of the filler-equipped circular cylinder-shaped body 20 as shown in FIG. 4. The case where the filler-equipped cylinder-shaped body is a filler-equipped circular cylinder-shaped body has been described above, but when the filler-equipped cylinder-shaped body is a filler-equipped elliptical cylinder-shaped body, when the inside diameter of the short axis direction of the filler-equipped elliptical cylinder-shaped body is $d_i$ (unit: mm), $0 \leq G \leq 0.1 d$, is satisfied.

The filler-equipped circular cylinder-shaped body 20 includes the metal plate material 1 and the filling portion 22.

The filling portion 22 includes the filler 2 and the slit 12, with the filler 2 fixed to the slit 12.

The term of "for the filler 2 to be filled throughout the slit 12 in the length direction $U_S$ of the slit 12" means that, as shown in FIG. 4, the state in which the filler 2 is fixed within the slit 12 at least across the width direction $U_W$ is formed across one end face 11c to the other end face 11d of the circular cylinder barrel portion 11 shown in FIG. 3. The ratio of the filler 2 in the slit 12 is preferably 90 to 100% in the width direction $U_W$ of the slit 12, and is preferably 90 to 100% in the length direction $U_S$ of the slit 12.

Filling the slit 12 with the filler 2 means that, as shown in FIG. 4, for example, the slit 12 is filled with the filler 2 from 0.95 $T_1$ or more to $T_1$ or less from the outer circumferential surface 11e of the circular cylinder barrel portion 11 along the $U_D$ direction. In the filling portion 22, gaps and defects may remain inside the filler 2 and between the filler 2 and the slit 12 because reforming is performed in the process C.

When the volume of the slit 12 shown in FIG. 1 is $V_S$ (unit: mm$^3$), and the apparent volume of the filler 2 in the filling portion 22 shown in FIG. 3 is $V_2$ (unit: mm$^3$), $0 < V_2$ $V_S$ is acceptable, but $V_S < V_2 1.1 V_S$ is preferable in consideration of the gaps and defects. Here, $V_S < V_2$ means that the apparent volume $V_2$ of the filler 2 is larger than the volume $V_S$ of the slit.

Figure 8:
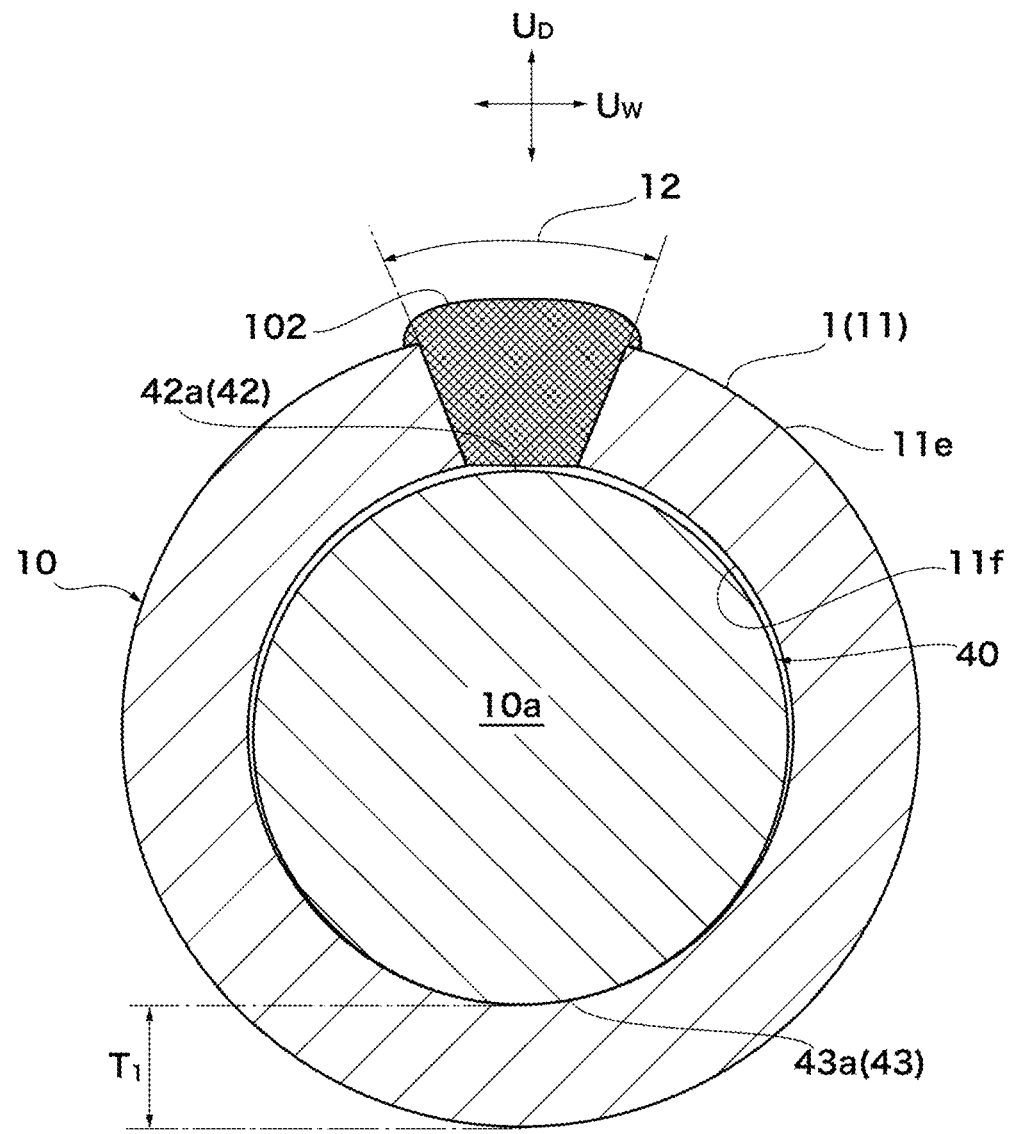
FIG. 8 is a schematic cross-sectional view showing one example of a state where a filler is overlaid in a process B1.
Figure 9:
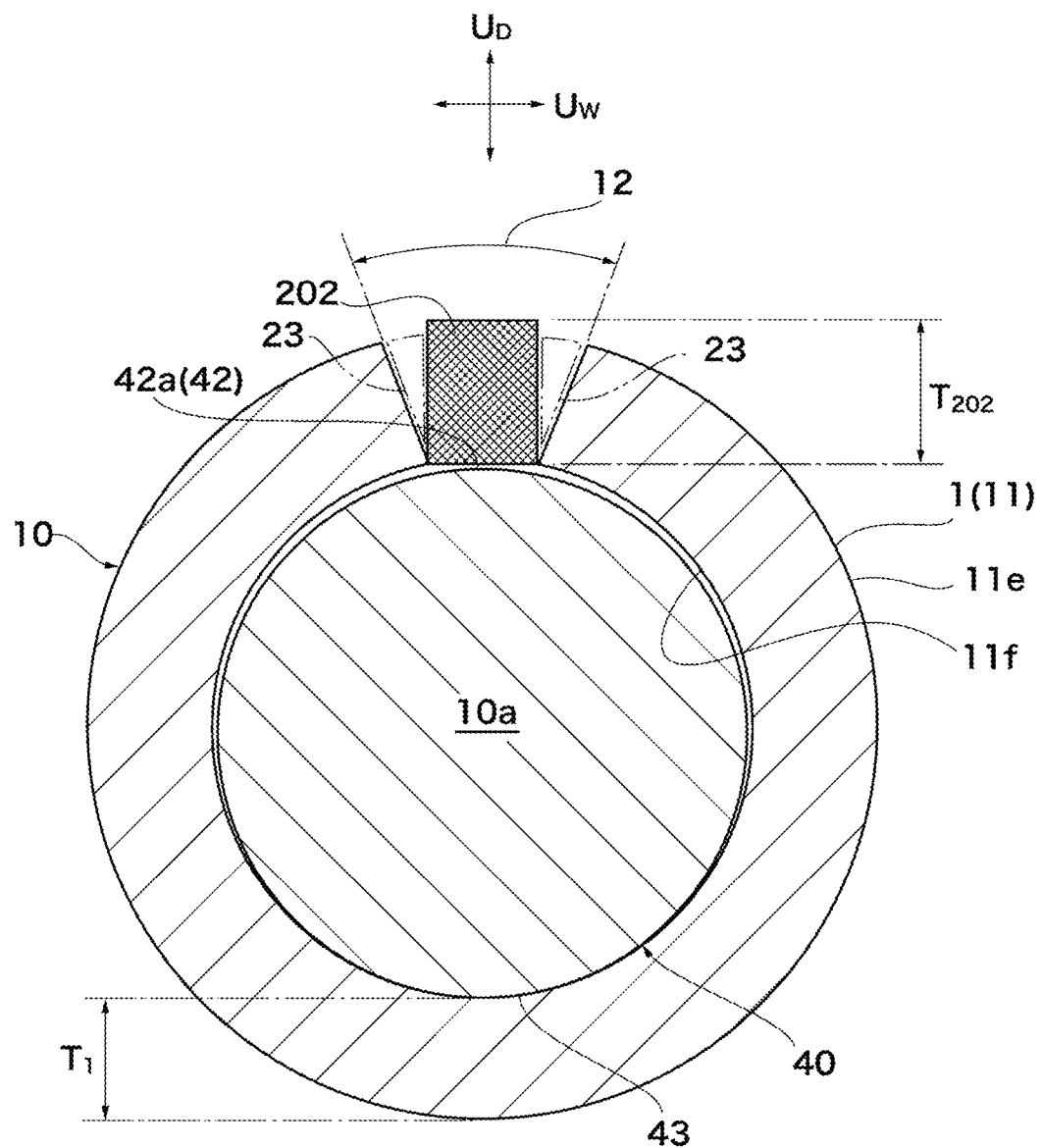
FIG. 9 is a schematic cross-sectional view showing one example of a state where a block material is fitted in a process B3.

The filler 2 is, for example, a welding material 102 (FIG. 8), molten metal (not shown), block material 202 (FIG. 9), wires 302 (FIG. 10), granules 402 (FIG. 11), or powder (not shown) having the same composition as the metal plate material 1. In addition, the filler 2 may take the form of a combination of components with a composition thereof different from the composition of the metal plate material 1. For example, the form of the block material may be a composite block material (not shown), being obtained combination of block-like components and including block-like components with a composition different from the composition of the metal plate material 1, the average composition of which is the same as the composition of the metal plate material 1. The form of the wire may be a wire bundle (not shown) of a plurality of wires, including wires with a composition different from the composition of the metal plate material 1, the average composition of which is the same as the composition of the metal plate material 1. The form of the granule may be a granular mixture (not shown), including a particle with a composition different from the composition of the metal plate material 1, the average composition of which is the same as the composition of the metal plate material 1. The form of the powder may be a powder mixture (not shown), including a particle with a composition different from the composition of the metal plate material 1, the average composition of which is the same as the composition of the metal plate material 1. FIGS. 8 and 9 show the form in which a thickness of the filler 2 is thicker than the wall thickness of the metal plate material 1.

The process B is preferably either one of the following processes B1 to B4. The slit 12 can be filled more efficiently.

(Process B1)

The process B is preferably, as shown in FIG. 8, the process B1 of overlaying the welding material 102 in the slit 12 by the MIG or TIG method. Since the welding material 102 is inserted into the slit 12 for overlaying, the slit 12 is easily filled with the welding material 102 from the outer circumferential surface 11e of the slitted circular cylinder-shaped body 10 to the wall thickness $T_1$ of the metal plate material 1 along the $U_D$ direction. In starting the process B1, it is preferable to install the backing jig 40 including the backing portion 42 in the inside 10a of the slitted circular cylinder-shaped body 10. When the welding material 102 is inserted into the slit 12 for overlaying, the front surface 42a of the backing portion 42 becomes an inner bottom of the slit 12, making it possible to prevent the welding material 102 from being excessively overlaid in the inside 10a of the slitted circular cylinder-shaped body 10, and to prevent the welding material 102 from spreading to the inner surface 11f. After the overlaying is completed, the welding material 102 cools down and is fixed to the slit 12, whereby the filling portion 22 is provided and the filler-equipped circular cylinder-shaped body 20 is formed.

(Process B2)

The process B is preferably the process B2 of pouring a molten body (not shown) into the slit 12. The state in which the molten body (not shown) is poured into the slit 12 is the same as the state shown in FIG. 8, except that the welding material 102 is the molten body (not shown). In starting the process B2, the backing jig 40 is preferably installed in the same way as the process B1. The front surface 42a of the backing portion 42 becomes the inner bottom of the slit 12, making it possible to prevent the molten body (not shown) from flowing down from the slit 12 into the inside 10a of the slitted circular cylinder-shaped body 10. The preferred composition of the molten body (not shown) and the process after pouring are the same as in the process B1.

(Process B3)

Figure 13:
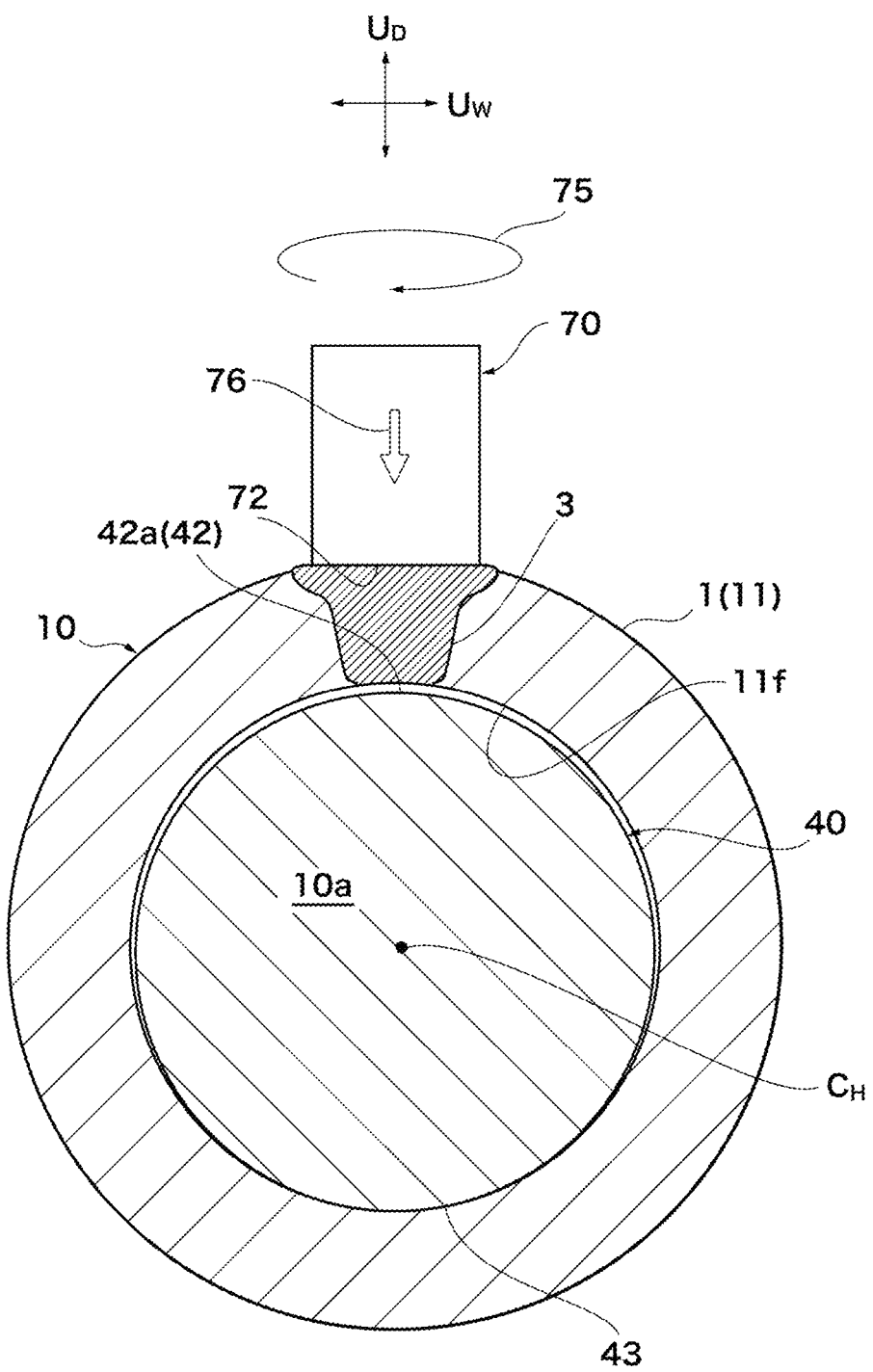
FIG. 13 is a cross-sectional view showing one example of a state where the granules are made into a plastic fluid by the friction stir rotation tool.

The process B is preferably, as shown in FIG. 9, the process B3 of fitting the block material 202 having a thickness $T_{202}$ equal to or greater than the wall thickness $T_1$ of the metal plate material 1 into the slit 12, and pressing with a friction stir rotation tool 70 with no probe as shown in FIG. 13. A gap 23 between the metal plate material 1 and the block material 202 can be filled by pressing.

In the process B3, it is preferable to install the backing jig 40 inside the slitted circular cylinder-shaped body 10, to grip the slitted circular cylinder-shaped body 10 by using a gripping member (not shown) so as not to cover the slit 12, to bring the inner surface 11f of the circular cylinder barrel portion 11 into contact with the front surface of the backing portion 42, to prevent the slitted circular cylinder-shaped body 10 from moving with respect to the table 60, to fit the block material 202 into the slit 12, and to press the slitted circular cylinder-shaped body 10 from the outer circumferential surface 11e side toward the backing portion 42 in the direction $U_D$ as shown in FIG. 9 by using the friction stir rotation tool 70 with no probe. The front surface 42a of the backing portion 42 becomes the inner bottom of the slit 12, and the slit 12 can be filled with the block material 202 more tightly. The length of the space $W_S$ in FIG. 2 preferably decreases toward the inner surface 11f of the circular cylinder barrel portion 11. When fitting the block material 202 into the slit 12, it is possible to easily fit the block material 202 into the slit and to prevent the block material 202 from moving even if the block material 202 is pressed with the friction stir rotation tool 70. If $T_1=T_{202}$, the friction stir rotation tool 70 may be used to press the block material 202 embracing the boundary portion with the metal plate material 1 (not shown). When pressing, the slit 12 may be plastically deformed.

(Process B4)

Figure 10:
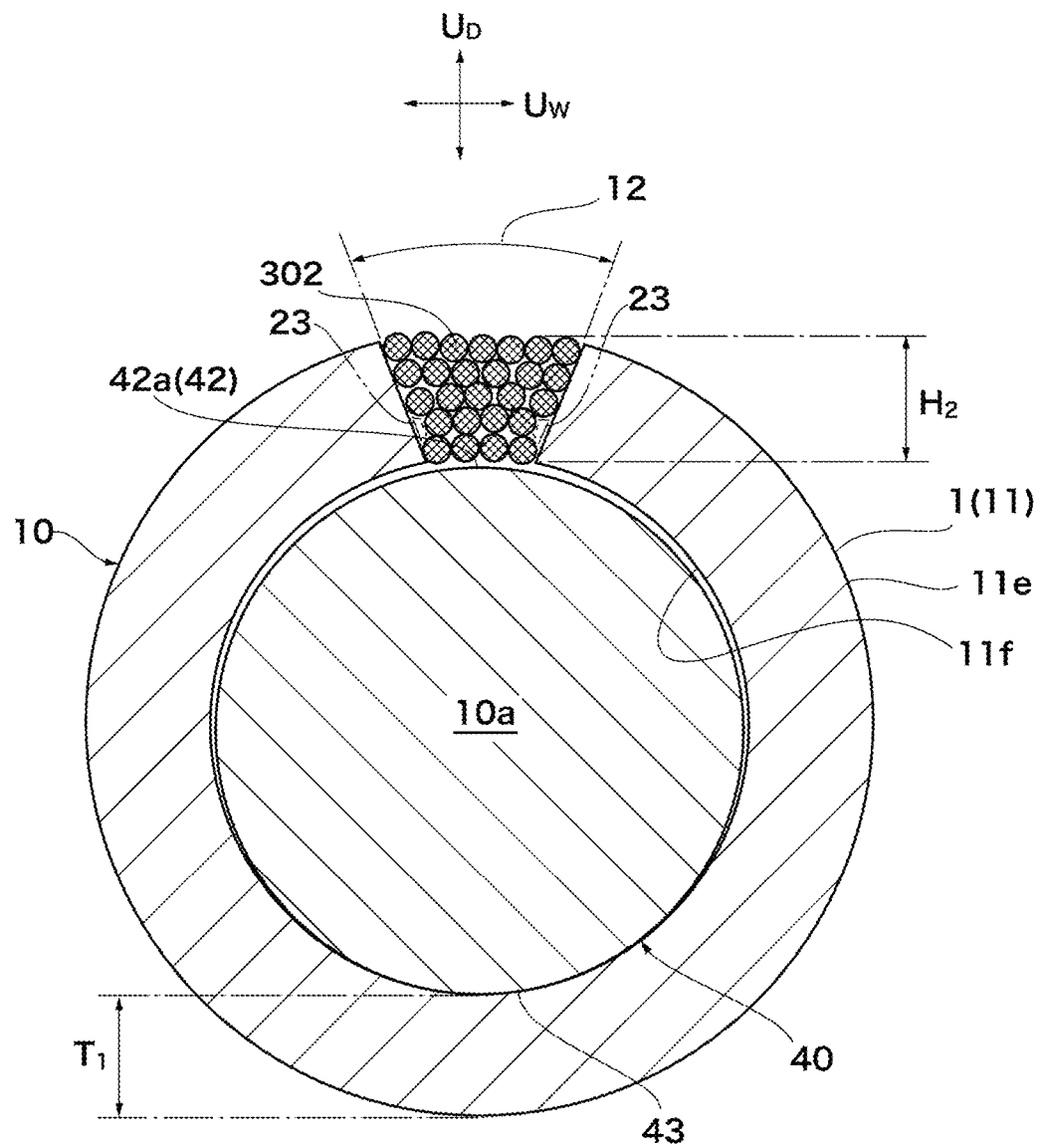
FIG. 10 is a schematic cross-sectional view showing one example of a state where wires are installed in a process B4.
Figure 11:
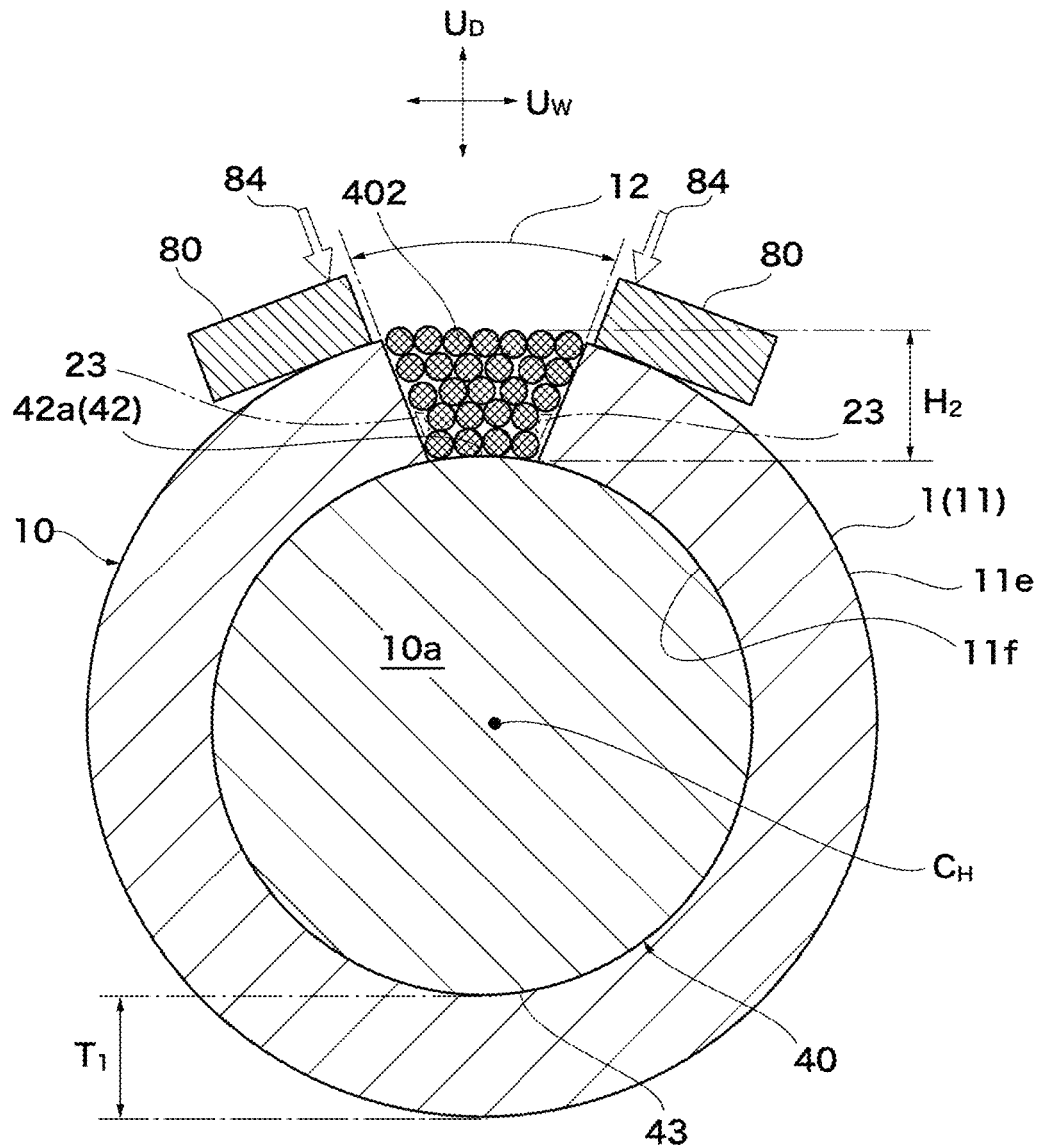
FIG. 11 is a schematic cross-sectional view showing one example of a state where granules are installed in the process B4.

FIG. 10 is a view showing a state where a plurality of wires 302 is bundled and installed in the slit 12 of the slitted circular cylinder-shaped body 10 shown in FIG. 2. FIG. 11 is a view showing a state where the granules 402 are installed in the slit 12 in the slit 12 of the slitted circular cylinder-shaped body 10 shown in FIG. 2.

Figure 12:
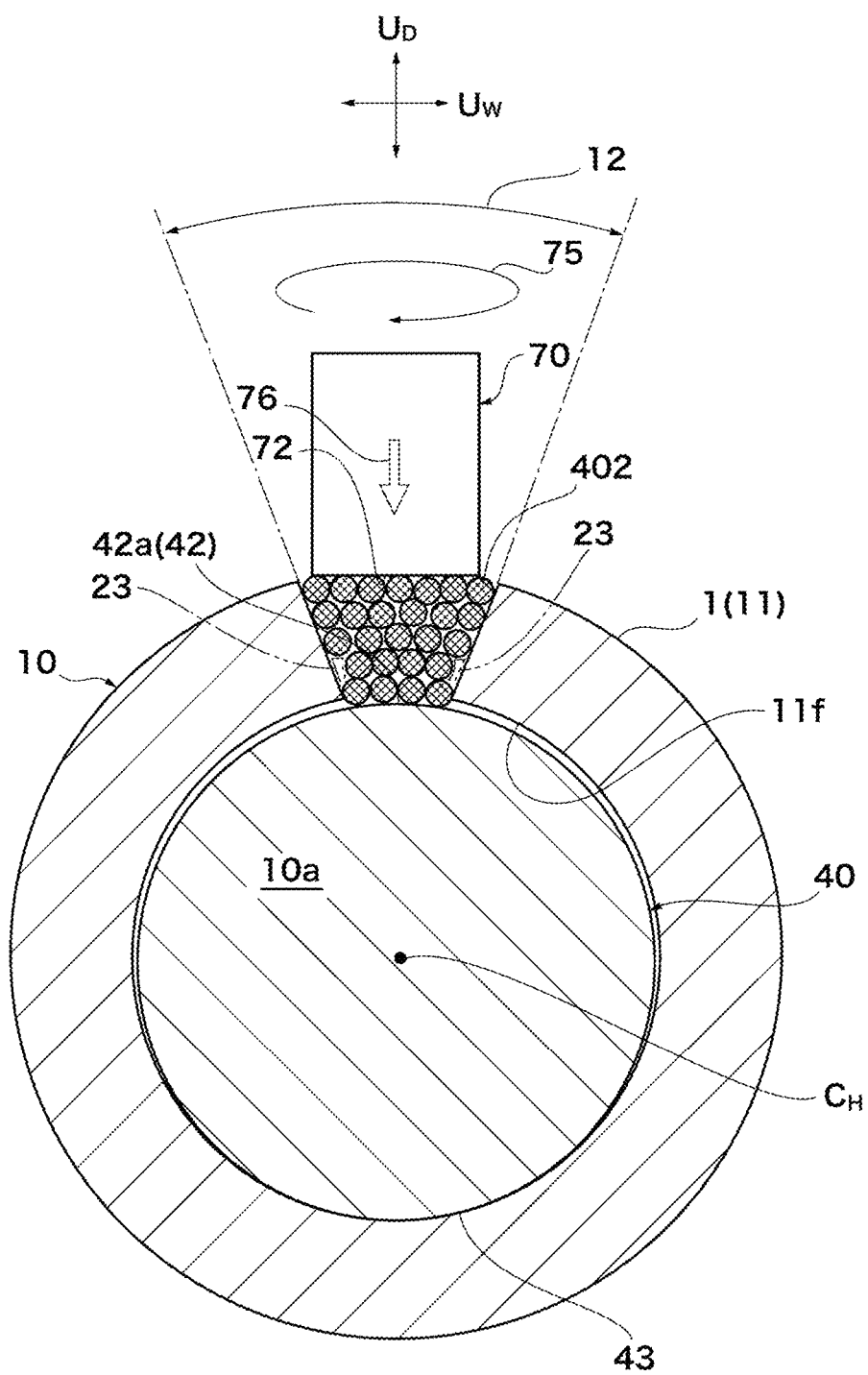
FIG. 12 is a cross-sectional view showing one example of a state where the granules are simply pressed by a friction stir rotation tool.

The process B is preferably the process B4 of at least one of installing the wires 302 in the slit 12 as shown in FIG. 10, installing the granules 402 in the slit 12 as shown in FIG. 11, or installing the powder in the slit 12 (not shown), and pressing with a hammer (not shown), a press (not shown), or the friction stir rotation tool 70 with no probe as shown in FIG. 12. In the process B4, as in the process B3, it is preferable to install the backing jig 40, to grip the slitted circular cylinder-shaped body 10, to install at least one of the wires 302, granules 402, and powder (not shown), and as in the process B3, to press the slitted circular cylinder-shaped body 10 toward the backing portion 42 from the outer circumferential surface 11e side. When installing at least one of the wires 302, granules 402, and powder (not shown) in the process B4, it is preferable to press both sides of the slit 12 with a pressing jig 80 to bring the inner surface 11f of the circular cylinder barrel portion 11 into close contact with the front surface of the backing portion 42 of the backing jig 40. As shown in FIG. 11, the pressing jig 80 has, for example, a flat plate shape. Pressing force 84 is applied to each of both sides of the slit 12 with the pressing jig 80 toward the center $C_H$ of the slitted circular cylinder-shaped body 10. The inner surface 11f of the circular cylinder barrel portion 11 to which the pressing force 84 is applied comes into contact with the front surface of the backing portion 42 of the backing jig 40. At this time, the gap between the inner surface 11f in the circular cylinder barrel portion 11 and the front surface of the backing portion 42 disappears. Since there is no gap between the inner surface 11f of the circular cylinder barrel portion 11 and the front surface of the backing portion 42, it is possible to prevent the wires 302, the granules 402, and the powder (not shown) from entering this gap. The case where the slitted cylinder-shaped body is a slitted circular cylinder-shaped body has been described above, but when the slitted cylinder-shaped body is a slitted elliptical cylinder-shaped body, the direction in which the pressing force 84 is applied is a direction toward the intersection $C_H$ of the short axis and the long axis.

The filler 2 has a form of the wires 302 only (FIG. 10), the granules 402 only (FIG. 11), the powder only (not shown), a combination of the wires 302 and granules 402 (not shown), a combination of the wires 302 and the powder (not shown), a combination of the granules 402 and the powder (not shown), or a combination of the wires 302, granules 402, and powder (not shown).

The wire 302 is a linear metal or alloy member having a length equal to or longer than a length $L_{10}$ of the slitted circular cylinder-shaped body 10 as shown in FIG. 1. The granule 402 is a particle-shaped metal or alloy member having a particle diameter of 1000 μm or more and less than 10000 μm. The powder (not shown) is a particle-shaped metal or alloy member having a particle diameter of 10 μm or more and less than 1000 μm.

When the form of the filler 2 is the form of the wires 302 only, the wires 302 are installed in the slit 12. Here, there is a case where the number of the wires 302 is only one (not shown), and a case where a plurality of wires 302 is bundled in a wire bundle as shown in FIG. 10. After the installation, for example, the wires 302 are pressed with a hammer (not shown) or a press (not shown) to push the wires 302 to the inner surface 11f side in the slit 12 to fill the gap 23 between the wires 302 and the metal plate material 1. After that, the wires 302 may be pressed with the friction stir rotation tool 70 to further fill the gap 23 between the metal plate material 1 and the wires 302. Assuming that the installation thickness of the wires 302 is $H_2$, it is preferable that $H_2 \geq T_1$. If $H_2=T_1$, the wires 302 may be directly pressed with the friction stir rotation tool 70 to fill the gap 23 between the metal plate material 1 and the wires 302 without using a hammer (not shown) or a press (not shown). In addition, the wires 302 may be pressed including a boundary portion (not shown) with the metal plate material 1.

When the form of the filler 2 is the form of the granules 402 only, as shown in FIG. 11, the form is the same as the form of the wires 302 except that the wires 302 are changed to the granules 402. When the form of the filler 2 is the form of the powder (not shown) only, the process B4 is performed in the same manner as the form of the granules 402 only.

When the form of the filler 2 is a combined form, the process B4 is performed in the same manner as the form of the granules 402 only.

Pressing with the friction stir rotation tool 70 means, for example, while simply pressing the granules 402 shown in FIG. 11 in a pressing direction 76 as shown in FIG. 12, deforming the granules 402 by rotation of a shoulder portion 72 of the friction stir rotation tool 70 as shown in FIG. 13 to generate a plastic fluid in a plastic area 3, and reducing the gap between the filler 2 and the slit 12 in the filling portion 22 after the filler-equipped circular cylinder-shaped body 20 is formed as shown in FIG. 4. Specifically, as shown in FIG. 12, the friction stir rotation tool 70 is rotated in a rotational direction 75, and the shoulder portion 72 of the friction stir rotation tool 70 is slowly pressed against the granules 402 in the pressing direction 76. When the shoulder portion 72 comes into contact with the granules 402, because of frictional heat generated by the rotation, the high-temperature plastic area 3 is generated about the contacted granules 402, the granules 402 are heated by heat conduction, and the plastic area 3 expands as shown in FIG. 13. At the same time, the rotational force given by the friction stir rotation tool 70 applies shearing force in the rotational direction 75 to the plastic fluid in the plastic area 3, the gap 23 is reduced, and the slit 12 is filled while the outer surface of the plastic fluid is further deformed to follow the shape of the slit 12. The same applies to other forms of the filler 2 such as the block material 202 only, the wires 302 only, the powder only (not shown), and combinations. Here, the friction stir rotation tool 70 includes, for example, Fe, Ni, Co, W, Ir, an alloy based on these metals, and a ceramic material. As the friction stir rotation tool 70, a friction stir rotation tool with no probe can be used. Pressing force for pressing the friction stir rotation tool 70 is adjusted in consideration of dimensions such as the thickness of the filler 2 and the wall thickness of the metal plate material 1 each time. By the pressing force, as shown in FIG. 13, plastic flow may be generated up to the inner surface 11$f$ side. The shoulder portion 72 has, for example, a flat shape, a rounded shape, or a rough surface having unevenness, and preferably a flat shape. It is preferable to grip the slitted circular cylinder-shaped body 10 and move the friction stir rotation tool 70 while pressing on the granules 402. In addition, the slit 12 may be deformed by pressing. In FIG. 12 or 13, as shown in FIG. 11, it is preferable to press both ends of the slit 12 with the pressing jig 80 and bring the inner surface 11$f$ of the circular cylinder barrel portion 11 into contact with the front surface of the backing portion 42 of the backing jig 40.

(Process C)

Figure 5:
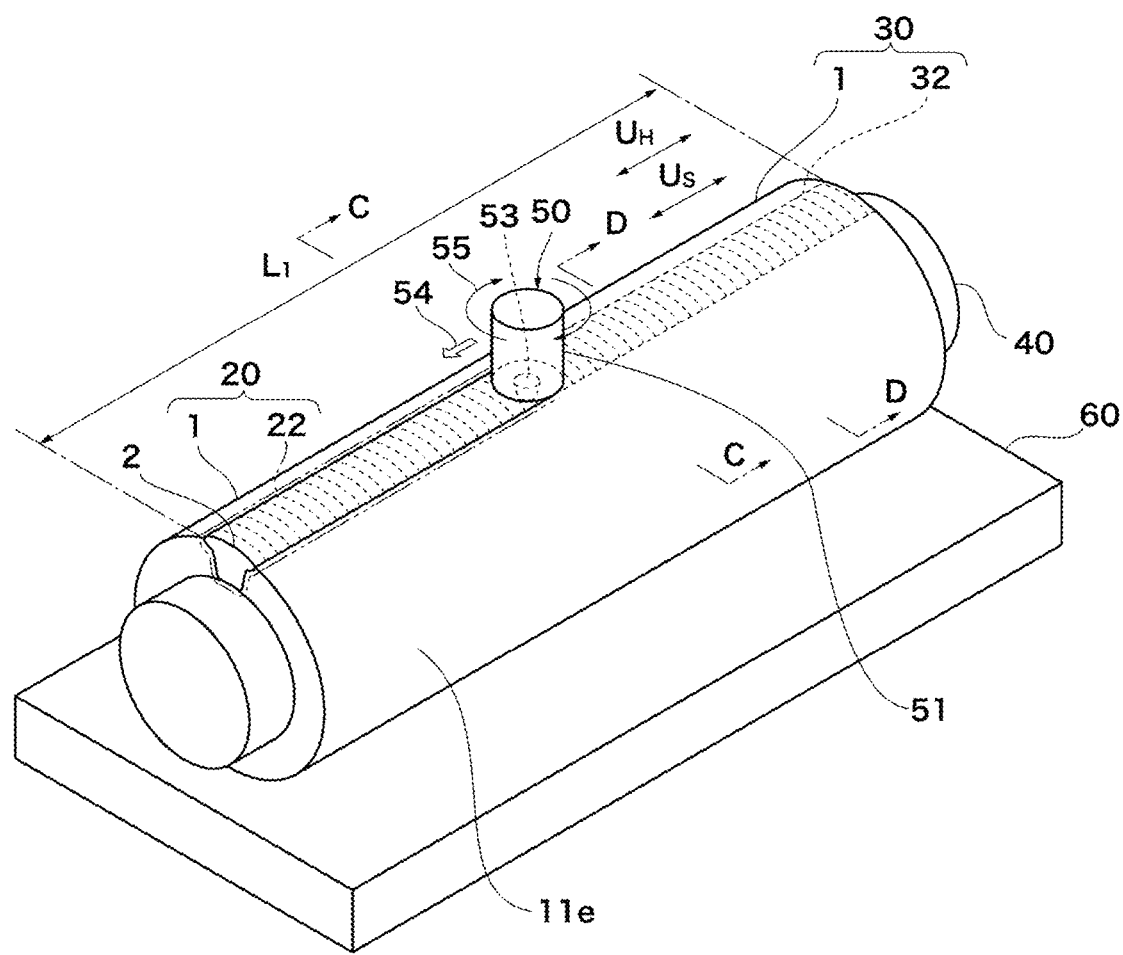
FIG. 5 is a perspective view showing the first form in the process of forming a metal circular cylinder material in a process C.
Figure 6:
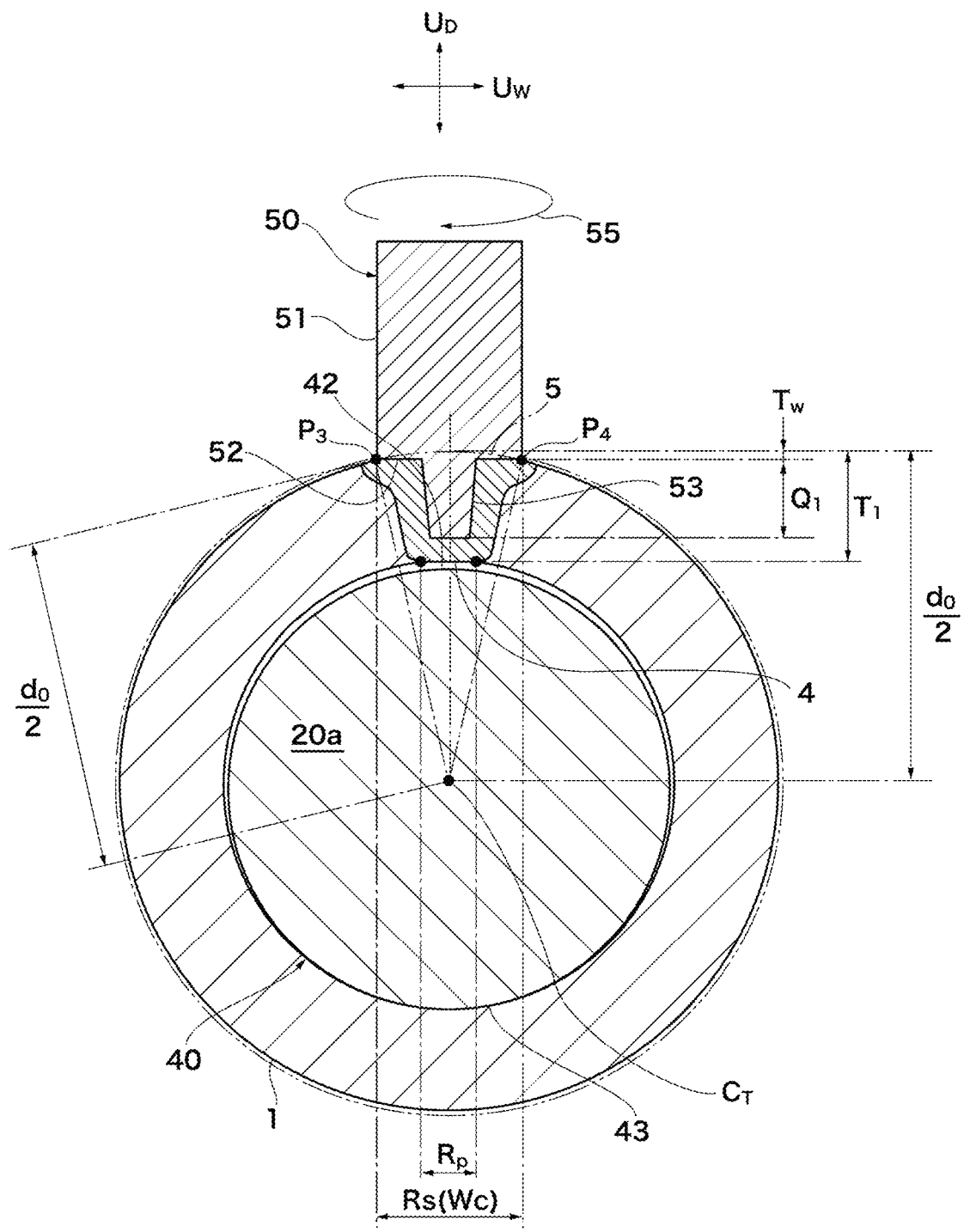
FIG. 6 is a cross-sectional view taken along a line C-C with a table omitted.
Figure 7:
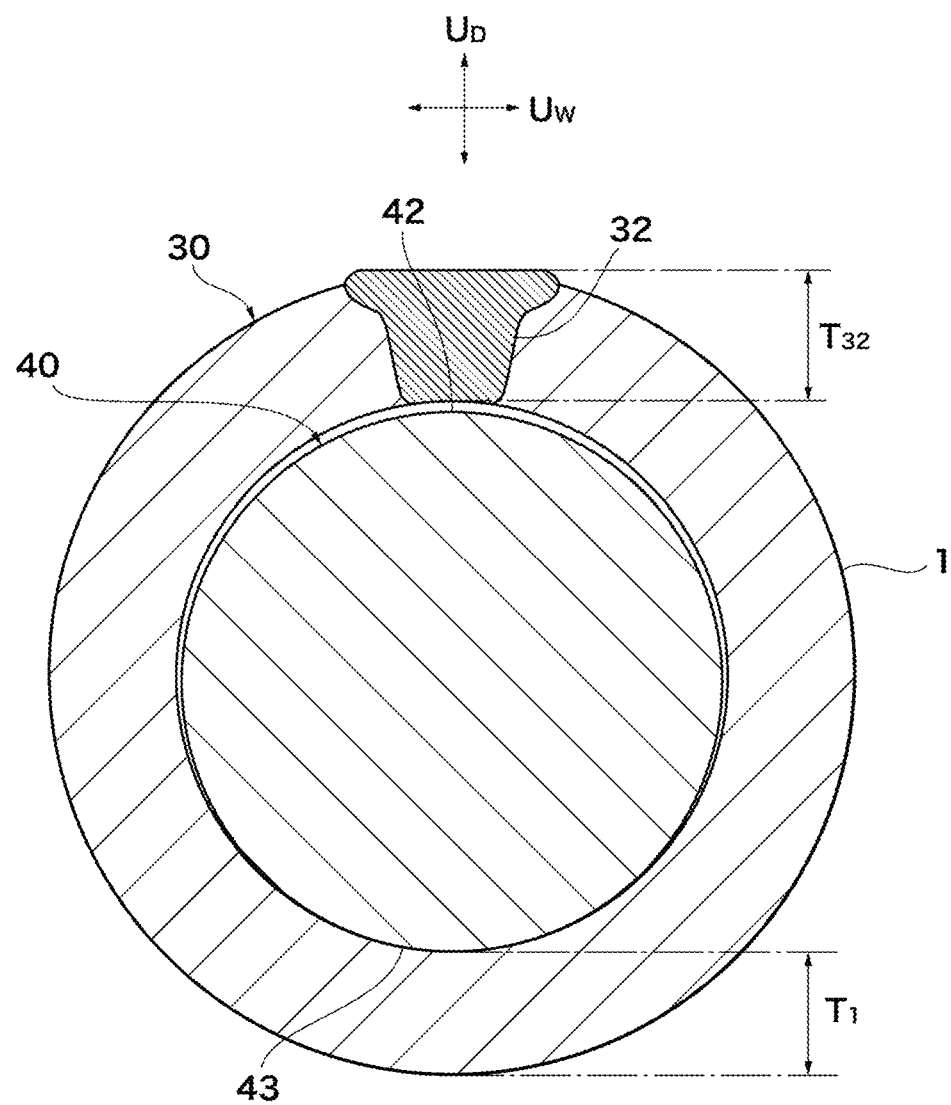
FIG. 7 is a cross-sectional view taken along a line D-D with a table omitted.

In starting the process C, as shown in FIGS. 5 to 7, the backing jig 40 of a columnar body and the table 60 are continuously used. In the process C, at least the probe 53 of the friction stir rotation tool 50 including the probe 53 is inserted at least into the filling portion 22, FSP is executed to reform at least the filling portion 22 of the filler-equipped circular cylinder-shaped body 20, and the metal circular cylinder material 30 including the FSP portion 32 is formed. After the reforming, the backing jig 40 is pulled out from the metal circular cylinder material 30.

As the friction stir rotation tool 50, the friction stir rotation tool used in normal FSP can be used. The friction stir rotation tool 50 includes, as shown in FIGS. 5 and 6, for example, a columnar trunk portion 51, a shoulder portion 52 provided at one end of the trunk portion 51, and the probe 53 provided on the shoulder portion 52. The friction stir rotation tool 50 includes, for example, the same material as the friction stir rotation tool 70 with no probe.

In starting insertion of the friction stir rotation tool 50, as shown in FIG. 6, it is preferable to install the backing jig 40 including the backing portion 42 in the inside 20$a$ of the filler-equipped circular cylinder-shaped body 20, after that, to grip the filler-equipped circular cylinder-shaped body 20 by using a gripping member (not shown) so as not to cover the filling portion 22, to prevent the filler-equipped circular cylinder-shaped body 20 from moving with respect to the table 60, and to insert the friction stir rotation tool 50 toward the backing portion 42 for reforming. The front surface 42$a$ of the backing portion 42 becomes a support surface that receives force caused by pressing, and it is possible to achieve higher quality reforming with no space or defects inside the FSP portion 32.

The principle of FSP will be described. The friction stir rotation tool 50 that rotates is inserted into the filler-equipped circular cylinder-shaped body 20, for example, the filling portion 22 from the outer circumferential surface 11$e$ side. At this time, in the friction stir rotation tool 50, as shown in FIGS. 5 and 6, the probe 53 is buried in the filling portion 22, and the shoulder portion 52 is pressed against the filling portion 22. When the probe 53 is inserted into the filling portion 22, the filling portion 22 is rapidly heated by friction caused by the rotation, and as a result, mechanical strength of the filling portion 22 decreases. The filler-equipped circular cylinder-shaped body 20 is gripped with respect to the table 60, and the friction stir rotation tool 50 is moved along a traveling direction 54 so as to pass over the filling portion 22. In the portion where the friction stir rotation tool 50 is inserted, frictional heat generated by the rotation of the shoulder portion 52 and the probe 53 of the friction stir rotation tool 50 while abutting against the filling portion 22 forms a high-temperature plastic area 4 in the filling portion 22 around the shoulder portion 52 and the probe 53. The rotational force given at the same time from the friction stir rotation tool 50 gives shearing force of a rotational direction 55 to the plastic fluid in the plastic area 4, and defects and voids included in the plastic fluid are removed and reforming is performed. After the friction stir rotation tool 50 has passed, the plastic fluid is cooled to become the solid FSP portion 32 as shown in FIGS. 5 and 7, and the metal circular cylinder material 30 including the FSP portion 32 is formed. All of these phenomena occur at temperatures lower than the melting point of the filler-equipped circular cylinder-shaped body 20. FIGS. 5, 6, and 7 show the form in which, assuming that movement of the friction stir rotation tool 50 in the traveling direction 54 is performed once one way from one end to the other end of the filling portion 22, the formation of the FSP portion 32 is completed by the movement.

FSP is executed so as to embrace at least the filling portion 22. The form of embracing at least the filling portion 22 includes, for example, the form of executing FSP only on the filling portion 22, the form of executing FSP not only on the filling portion 22 but also protruding over both sides of the metal plate material 1 sandwiching the filling portion 22, and the form of executing FSP not only on the filling portion 22 but also on the entire metal plate material 1.

As shown in FIG. 6, when the shoulder diameter of the shoulder portion 52 is $R_S$ (unit: mm) and the probe diameter of the probe 53 is $R_P$ (unit: mm), the ratio $R_P/R_S$ between the shoulder diameter and the probe diameter is, for example, 0.3 or more and 0.5 or less.

The shoulder portion 52 has, for example, a recess shape, a protrusion shape, and a flat shape, preferably a recess shape.

When the shoulder portion 52 has a flat shape, as shown in FIG. 6, the front surface of the root portion of the probe 53 in the shoulder portion 52 is in contact with an assumed outer circumferential surface 5 of the metal plate material 1, and the friction stir rotation tool 50 is further pushed in and abutted such that edges $P_3$ and $P_4$ of the shoulder portion 52 are brought into contact with the assumed outer circumferential surface 5. At this time, the shoulder portion 52 is pressed against the plastic fluid in the plastic area 4 with the thickness reduced, by a maximum thickness reduction $T_W$, from the assumed outer circumferential surface 5. The maximum thickness reduction $T_W$ (unit: mm) preferably satisfies $0 \leq T_W \leq 0.5$.

A preferred upper limit of the shoulder diameter $R_S$ is also a preferred upper limit $W_C$ of the pressing width of the shoulder portion 52 against the plastic fluid. The preferred upper limit $W_C$ is, as shown in FIG. 6, a pressing width of the shoulder portion 52 with the edges $P_3$ and $P_4$ of the shoulder portion 52 being in contact with the assumed outer circumferential surface 5 in a state of the thickness maximally reduced, i.e., reduced by 0.5 mm, from the assumed outer circumferential surface 5. When the center of the assumed outer circumferential surface 5 is $C_T$, this upper limit $W_C$ is the length of the base $P_3P_4$ in the isosceles triangle $P_3C_TP_4$. Assuming that the outside diameter of the slitted circular cylinder-shaped body 10 shown in FIG. 2 is $d_o$ (unit: mm), the length of the base $P_3P_4$, that is, the preferred upper limit $W_C$ is $(2d_o-1)^{1/2}$. The case where the slitted cylinder-shaped body is a slitted circular cylinder-shaped body has been described above, but when the slitted cylinder-shaped body is a slitted elliptical cylinder-shaped body, it is assumed that the outside diameter of the short axis direction of the slitted elliptical cylinder-shaped body is $d_o$ (unit: mm).

The relationship between the space length $W_S$ in the process A shown in FIG. 2 and the probe diameter $R_P$ shown in FIG. 6 is preferably $W_S \leq R_P$. At this time, considering the preferred upper limit $W_C$ and the ratio $R_P/R_S$ of the shoulder diameter and the probe diameter, $W_S < 0.4 \times (2d_o-1)^{1/2}$ is preferable. It is possible to reduce the labor of moving the friction stir rotation tool 50 while facilitating integration of the metal plate material 1 and the filler 2. The case where the slitted cylinder-shaped body is a slitted circular cylinder-shaped body has been described above, but when the slitted cylinder-shaped body is a slitted elliptical cylinder-shaped body, it is assumed that the outside diameter of the short axis direction of the slitted elliptical cylinder-shaped body is $d_o$ (unit: mm).

As shown in FIG. 6, the relationship between the length $Q_1$ (unit: mm) of the probe 53 and the wall thickness $T_1$ (unit: mm) of the metal plate material 1 preferably satisfies $0 < Q_1 \leq (T_1-0.5)$. It is possible to stir even if $Q_1$ is 0, but the stirring capacity is improved when $Q_1 > 0$. If $Q_1$ exceeds $(T_1-0.5)$, in the range of preferred thickness reduction $T_W$, when the edges $P_3$ and $P_4$ of the shoulder portion 52 are pressed so as to be in contact with the assumed outer circumferential surface 5, the probe 53 may penetrate the metal plate material 1. In addition, when the backing jig 40 is installed in the inside 20a of the filler-equipped circular cylinder-shaped body 20, the probe 53 penetrating the metal plate material 1 may rub the backing portion 42.

The metal circular cylinder material 30 preferably includes either one of Au, Ag, Al, Cu, Zn, Au-base alloy, Ag-base alloy, Al-base alloy, Cu-base alloy, or Zn-base alloy. The metal circular cylinder material 30 can be produced even with a material that has high thermal conductivity and/or is easily oxidized.

When the filler 2 is a granular mixture (not shown), including a particle with a composition different from the composition of the metal plate material 1, the average composition of which is the same as the composition of the metal plate material 1, there is a possibility that imbalance in the composition component is created in the filler 2 in the filling portion 22. Since the FSP causes stirring in the plastic area 4, the filling portion 22 is reformed and there is no imbalance in the composition, and the metal circular cylinder material 30 including the FSP portion 32 having the same composition as the composition of the metal plate material 1 can be obtained.

(Process D)

Figure 14:
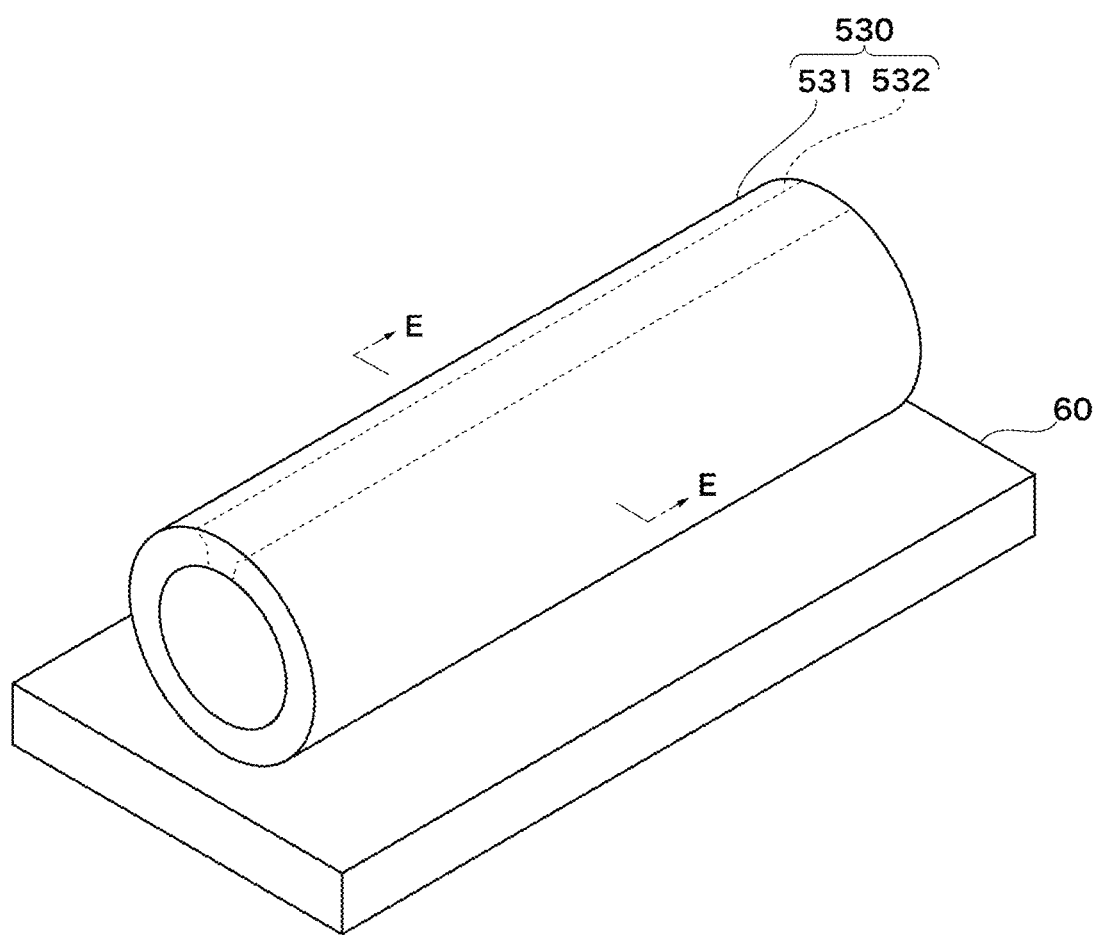
FIG. 14 is a perspective view showing one example of a metal circular cylinder material to which plastic working is applied in a process D.
Figure 15:
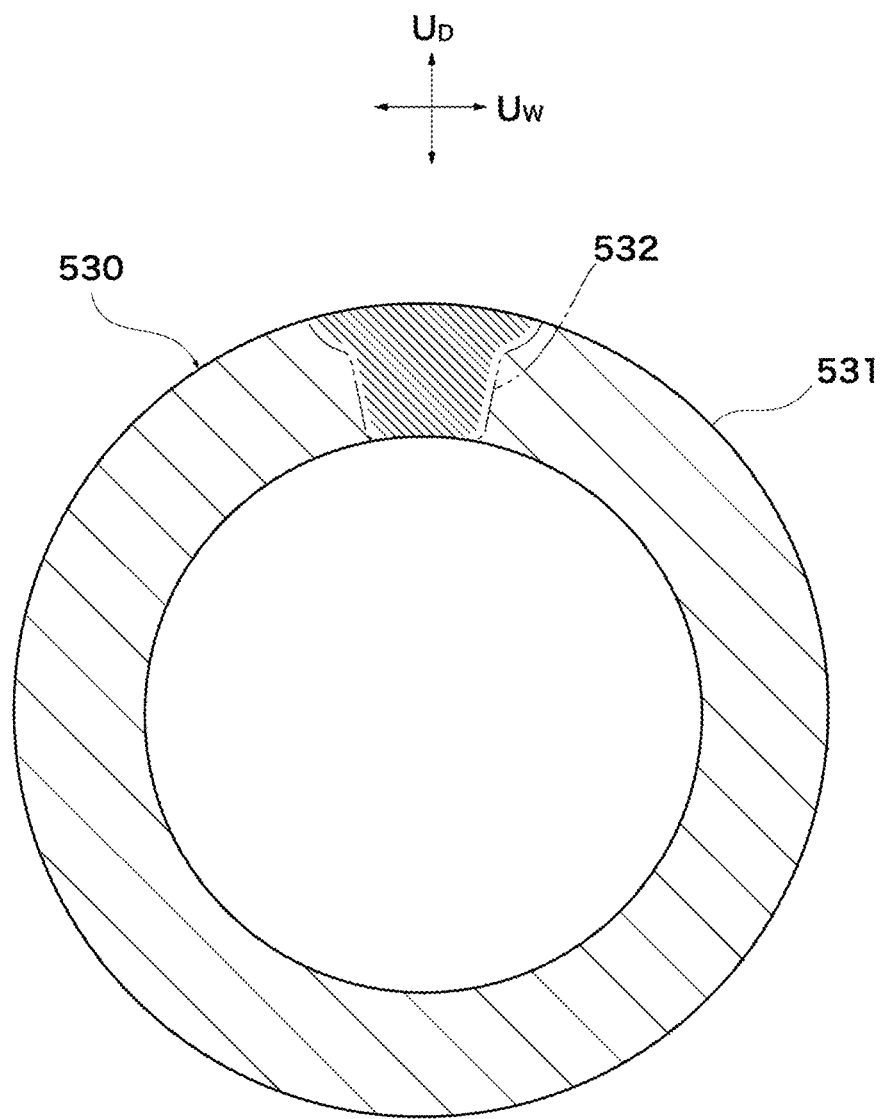
FIG. 15 is a cross-sectional view taken along a line E-E with a table omitted.

After the process C, the method for producing the metal cylinder material preferably further includes a process D of applying plastic working to at least the FSP portion 32 of the metal circular cylinder material 30. By adding a working distortion by the plastic working, it is possible to adjust the crystal grain between the FSP portion 32 and the metal plate material 1 of the metal circular cylinder material 30 shown in FIGS. 5 and 7, and to improve the uniformity of size of the crystal grain. In addition, as shown in FIGS. 14 and 15, it is possible to produce a metal circular cylinder material 530 that has a beautiful appearance and is integrated with a circular cylinder barrel portion 531 and an FSP portion 532 having a uniform wall thickness. For example, after the process C is finished, if the wall thickness $T_1$ of the metal plate material 1 is more than wall thickness $T_{32}$ of the FSP portion 32, it is preferable to apply plastic working. The form of executing plastic working at least to the FSP portion 32 is, for example, the form of execution only to the FSP portion 32, the form of execution not only to the FSP portion 32 but also to both sides of the metal plate material 1 sandwiching the FSP portion 32, and the form of execution not only to the FSP portion 32 but also to the entire metal plate material 1. The form of plastic working is, for example, drawing, extrusion, or die forging. The metal cylinder material obtained by plastic working may be a metal elliptical cylinder material, but is preferably a metal circular cylinder material.

(Process E)

Between the process C and the process D, after the process D, or both between the process C and the process D and after the process D, the method for producing the metal cylinder material preferably further includes a process E of performing heat treatment on the metal circular cylinder material 30 at a temperature equal to or higher than the recrystallization temperature of the metal plate material 1. It is possible to reduce internal stress of the metal circular cylinder material 30, and it is possible to adjust the crystal grain between the FSP portion 32 and the metal plate material 1 and to improve the uniformity of size of the crystal grain. When the recrystallization temperature of the metal plate material 1 is $S_R$ (temperature unit: K), it is preferable to perform heat treatment in the temperature range of $0.65S_R$ or more and $0.95S_R$ or less. More preferably, $0.65S_R$ or more and $0.90S_R$ or less, and particularly preferably $0.70S_R$ or more and $0.80S_R$ or less. If the heat treatment temperature is less than $0.5S_R$, it may not be possible to reduce the internal stress. In addition, it may not be possible to improve the uniformity of the size of the crystal grain between the FSP portion 32 and the metal plate material 1. If the heat treatment temperature exceeds $0.95S_R$, thermal deformation of the metal circular cylinder material 30 may occur. The heat treatment time is preferably 30 minutes or more, more preferably 60 minutes or more, and particularly preferably 120 minutes or more after the start of heat treatment. If the heat treatment time is less than 30 minutes, the metal circular cylinder material 30 may not be sufficiently heated to reduce the internal stress. In addition, it may not be possible to improve the uniformity of the size of the crystal grain of the FSP portion 32 and the metal plate material 1. The upper limit of the heat treatment time is preferably 1440 minutes or less, and more preferably 720 minutes or less. The internal stress can be checked by common methods such as hardness measurement.

The wall thickness $T_A$ of a place of the metal circular cylinder material 30 other than the FSP portion 32 is preferably 2 mm or more and 25 mm or less, and the length $L_1$ of the metal circular cylinder material 30 is preferably 500 mm or more. The long metal circular cylinder material 30 can be produced more efficiently. Here, the wall thickness $T_A$ of a place of the metal circular cylinder material 30 other than the FSP portion 32 is the wall thickness $T_1$ of the metal plate material 1. The upper limit of the length $L_1$ of the metal circular cylinder material 30 is, for example, 20000 mm or less, and preferably 10000 mm or less, and more preferably 4000 mm or less.

(Usage)

The metal circular cylinder material 30 is preferably the entire or part of a sputtering target, a pressure vessel capsule, or a pressure vessel liner. The form of the metal circular cylinder material 30 is the entire sputtering target, part of the sputtering target, entire pressure vessel capsule, part of the pressure vessel capsule, entire pressure vessel liner, or part of the pressure vessel liner. Using these devices or components, it is possible to easily inhibit the long wall thickness variation at low cost.

[Second Form]

Figure 16:
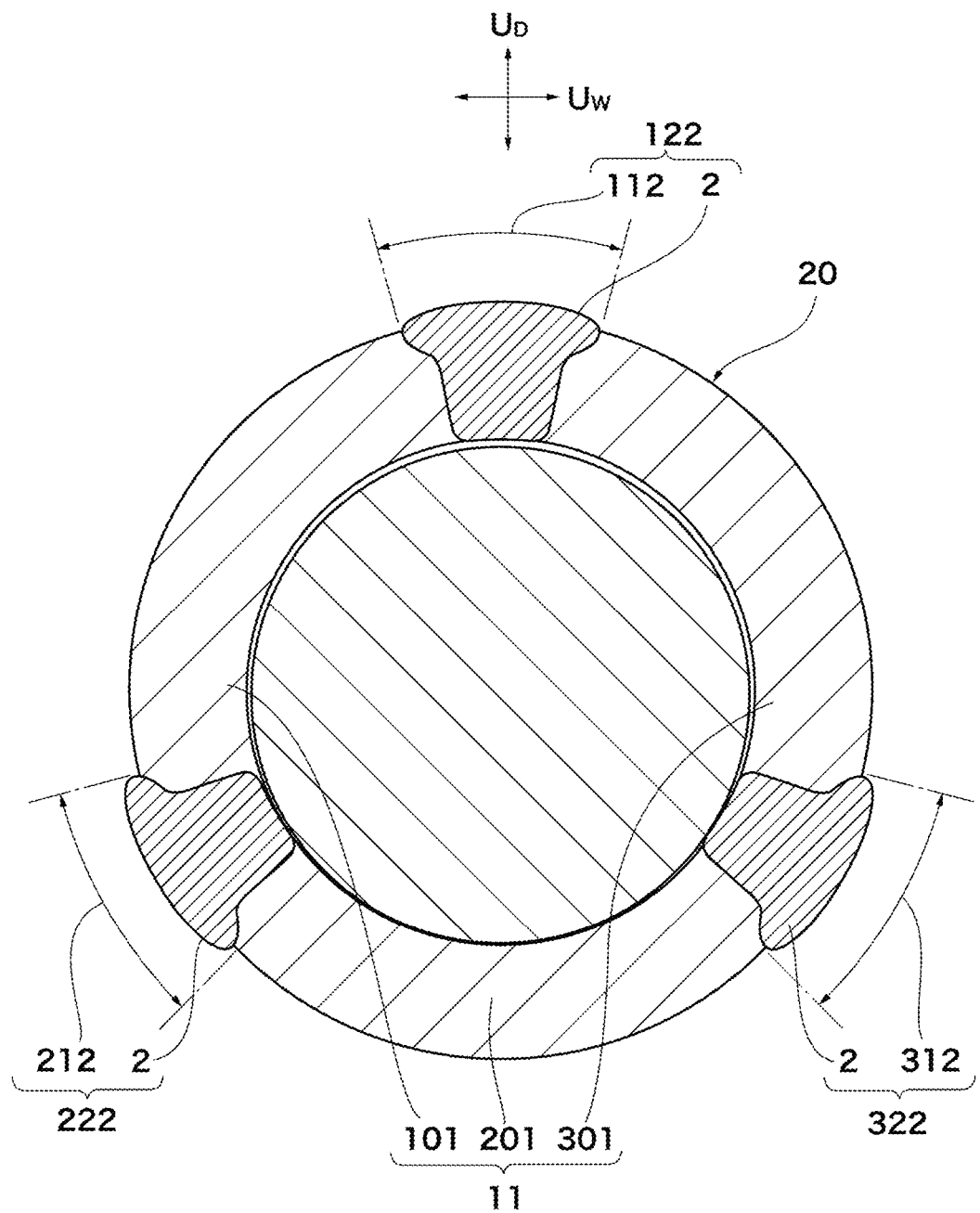
FIG. 16 is a schematic cross-sectional view showing a second form of the filler-equipped circular cylinder-shaped body in the process B.

Next, a second form of the method for producing a metal cylinder material will be described in detail, focusing on differences from the first form. In the second form, a slitted circular cylinder-shaped body is used that has a shape of one circular cylinder obtained by combining two or more metal plate materials in the process A with the slit being a gap between end faces, opposite to each other with a space, of adjacent metal plate materials. In the second form, if there are two metal plate materials, the number of slits is two, and after that, as the number of the metal plate materials increases by one, the number of slits increases by one. As a typical example, as shown in FIG. 16, the form of three metal plate materials 101, 201, and 301 and three slits 112, 212, and 312 will be described. The filler-equipped circular cylinder-shaped body 20 includes three filling portions 122, 222, and 322.

The appearance shape of a plate surface arranged by developing the metal plate materials 101, 201, and 301, in the filler-equipped circular cylinder-shaped body 20 shown in FIG. 16, in a plane, is similar to the case of developing the metal plate material 1 shown in FIG. 4 in the first form.

(Process A)

When forming the slitted circular cylinder-shaped body (not shown) by combining the three metal plate materials 101, 201, and 301, it is preferable to use a gripping member (not shown) to fasten the metal plate materials 101, 201, and 301 to the backing jig 40 of a columnar body so as not to cover the slits 112, 212, and 312. It is possible to maintain the circular cylindrical shape of the slitted circular cylinder-shaped body (not shown). This backing jig 40 can be continuously used in the process B and the process C.

The slits 112, 212, and 312 do not preferably intersect each other. From the viewpoint of simplifying operations in the process B and the process C, more preferably, the slits 112, 212, and 312 are parallel to each other. When the length direction $U_S$ of the slit 12 makes an angle with respect to the length direction $U_H$ of the circular cylinder barrel portion 11, the appearance shape of the plate surface obtained by developing the metal plate materials 101, 201, and 301 in a plane may be a triangle in addition to a parallelogram and a rhombus.

(Process B and Process C)

The order in which the slits 112, 212, and 312 are filled with the filler 2 in the process B is not limited. As the form of the order of the process B and the process C, the form $N_A$ of executing the process C after the process B is completed in all the slits 112, 212, and 312 is preferable. The form of the order of the process B and the process C is also preferably the form $N_B$ of executing the process C after executing the process B to either one of the slits 112, 212, and 312, subsequently executing the process C after executing the process B to one of the remaining two slits, and finally executing the process C after executing the process B to the remaining one slit. When the process B is the process B3 or the process B4, it is preferable to adopt the form $N_B$. To make it easier to fill a remaining unfilled slit with the filler 2, it is possible to prevent a previously filled filler 2 from spilling out of one or some of the slits 112, 212, and 312 when positions of the slits are moved.

Comparative Example

Technology for Butting so as to Eliminate Gap Between End Faces

Figure 17:
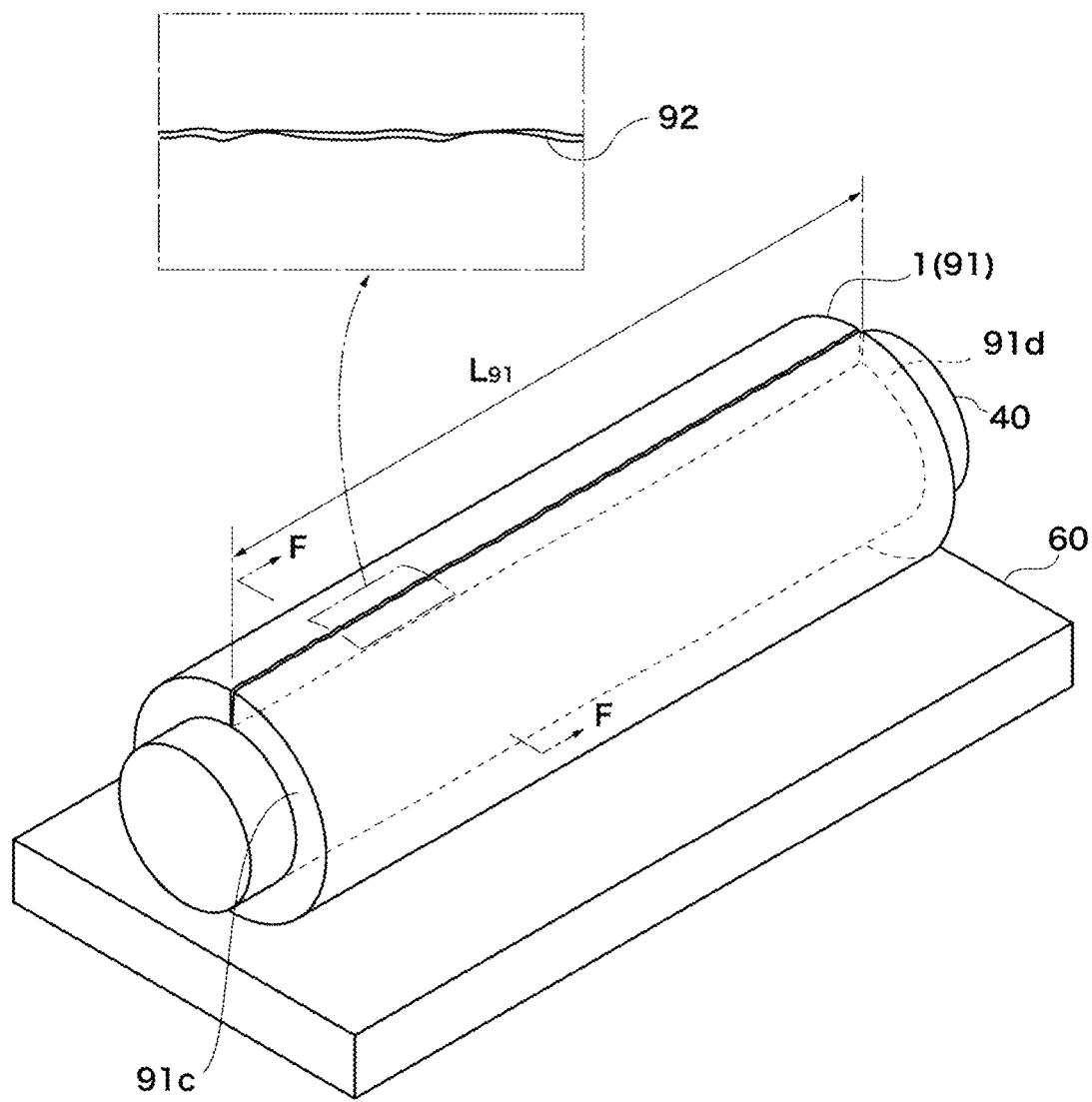
FIG. 17 is a perspective view showing a comparative example of a circular cylinder-shaped body.
Figure 18:
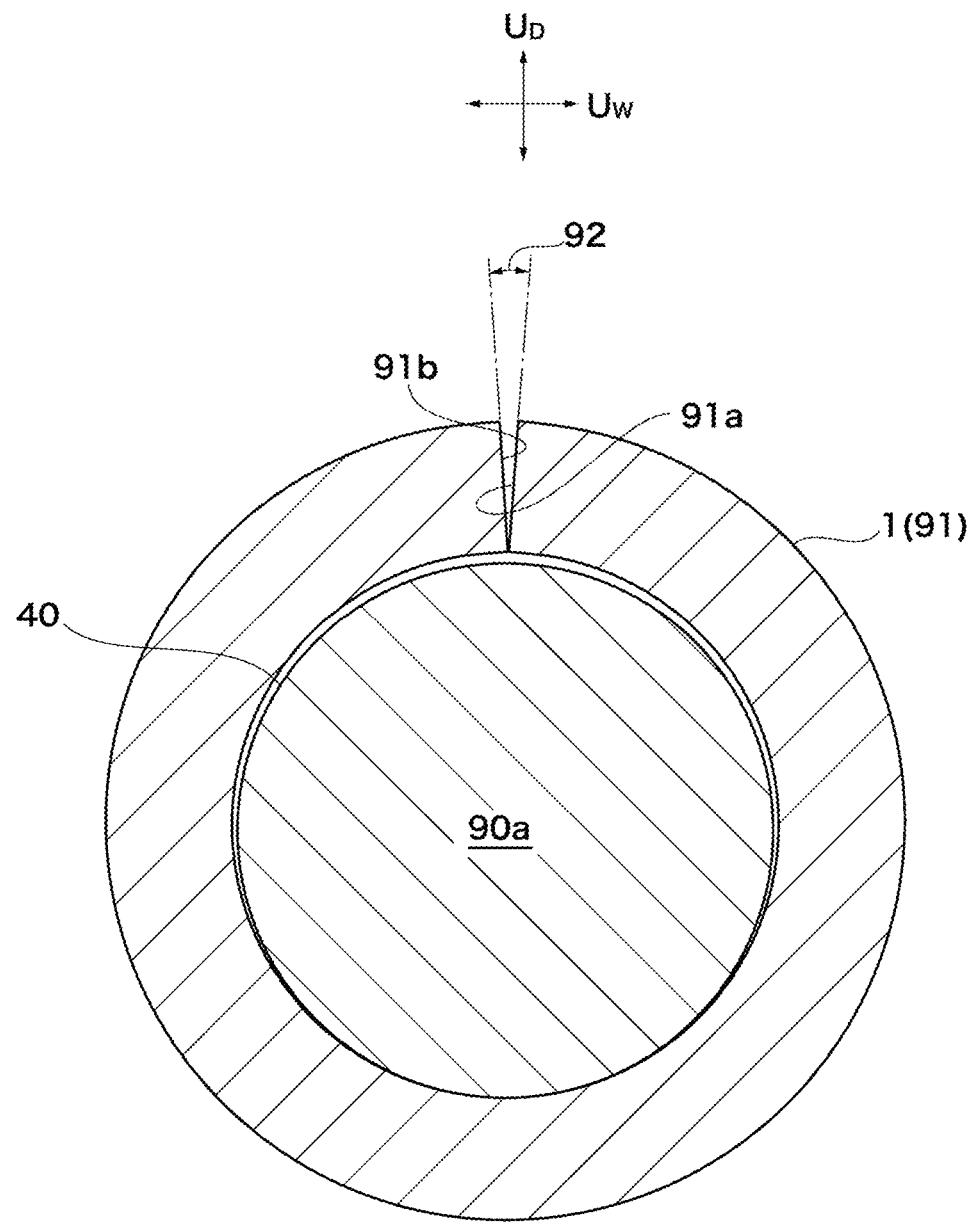
FIG. 18 is a cross-sectional view taken along a line F-F with a table omitted.

FIGS. 17 and 18 are views showing a state where the backing jig 40 is installed in an inside 90a of a circular cylinder-shaped body 91 formed by rounding one metal plate material 1 and butting one end face 91a and the other end face 91b of the metal plate material 1. When rounding one metal plate material 1 and butting the end face 91a and the end face 91b to form the circular cylinder-shaped body 91, on the side of one end face 91c and the side of the other end face 91d of the circular cylinder-shaped body 91, it is easy to butt the end face 91a and the end face 91b with each other, but in a central portion of the circular cylinder-shaped body 91, it is difficult to bend the end face 91a and the end face 91b until butting each other. As the length $L_{91}$ of the circular cylinder-shaped body 91 increases, the butting in the central portion of the circular cylinder-shaped body 91 becomes more difficult. Even if the end face 91a and the end face 91b can be butted, the end face 91a and the end face 91b are affected by the roughness of the surface and the deformation in the process of rounding the metal plate material 1, generating an open discontinuous portion 92. It is difficult to join the discontinuous portion 92 by executing friction stir welding (FSW) on the discontinuous portion 92.

[Third to Fifth Forms]

Third to fifth forms of the method for producing a metal cylinder material will be described in detail, focusing on differences from the first form. The third to fifth forms are forms using a modification of the backing jig 40.

Figure 19:
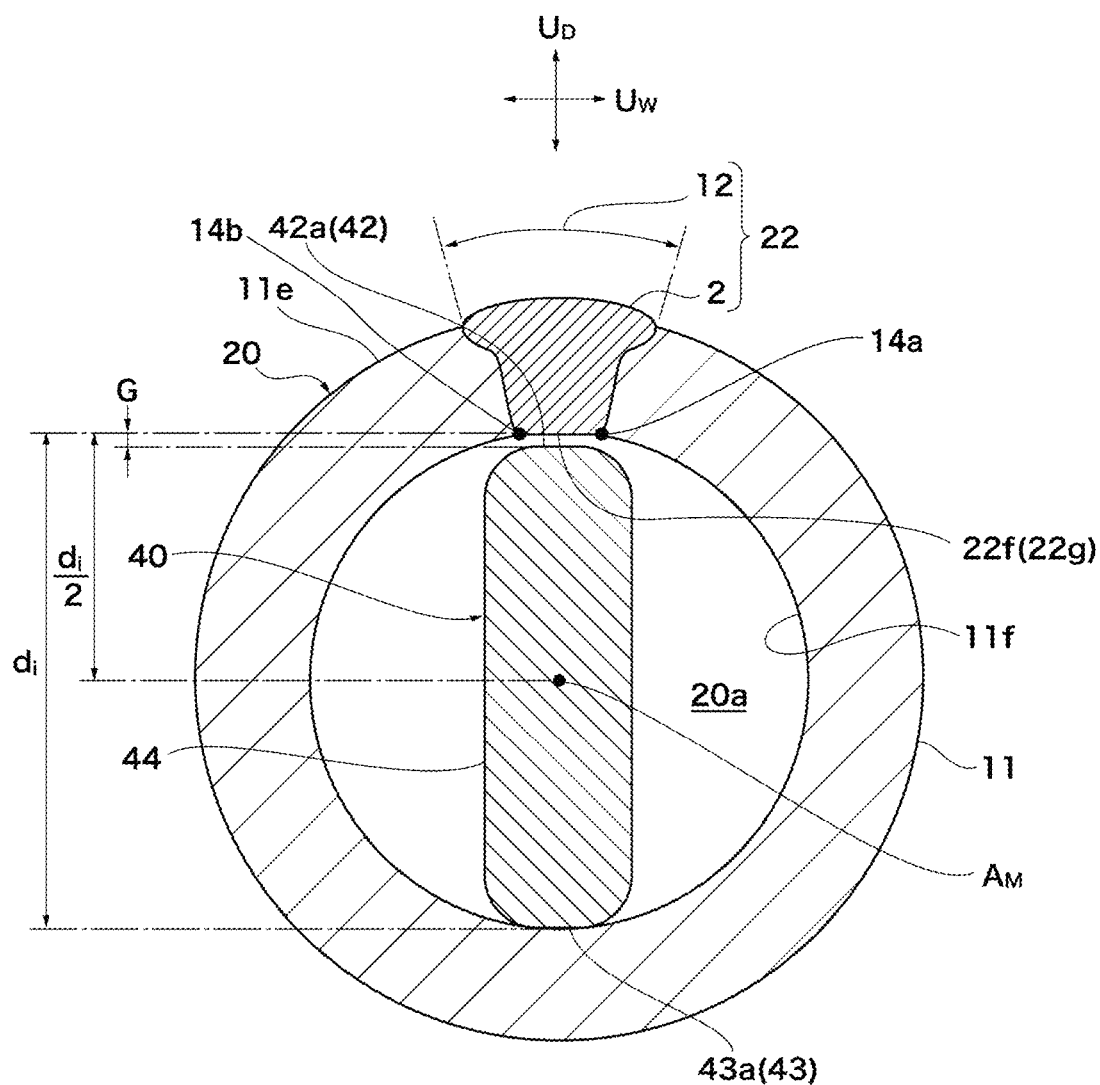
FIG. 19 is a schematic cross-sectional view for describing a first modification of a backing jig.
Figure 20:
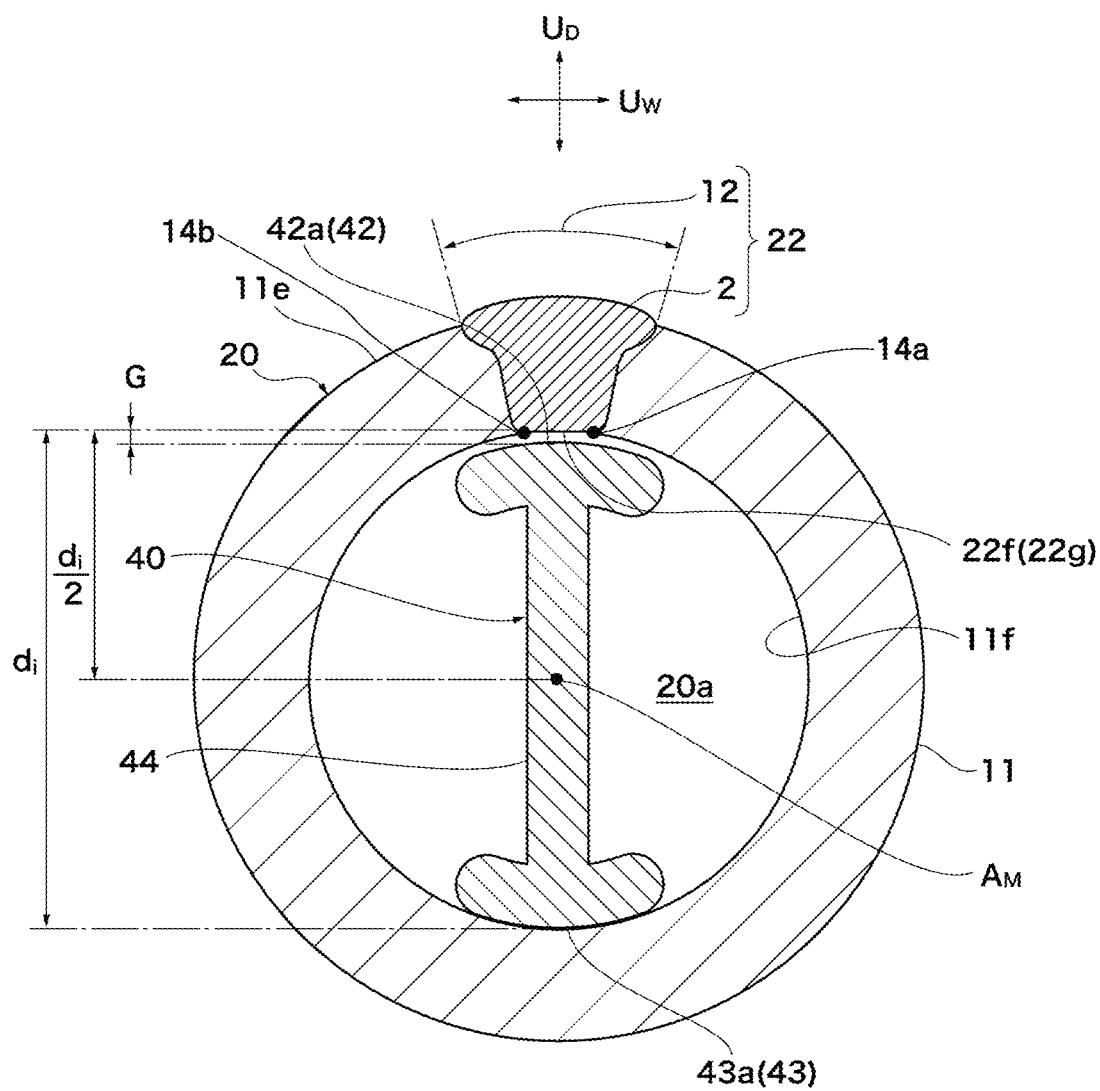
FIG. 20 is a schematic cross-sectional view for describing a second modification of the backing jig.
Figure 21:
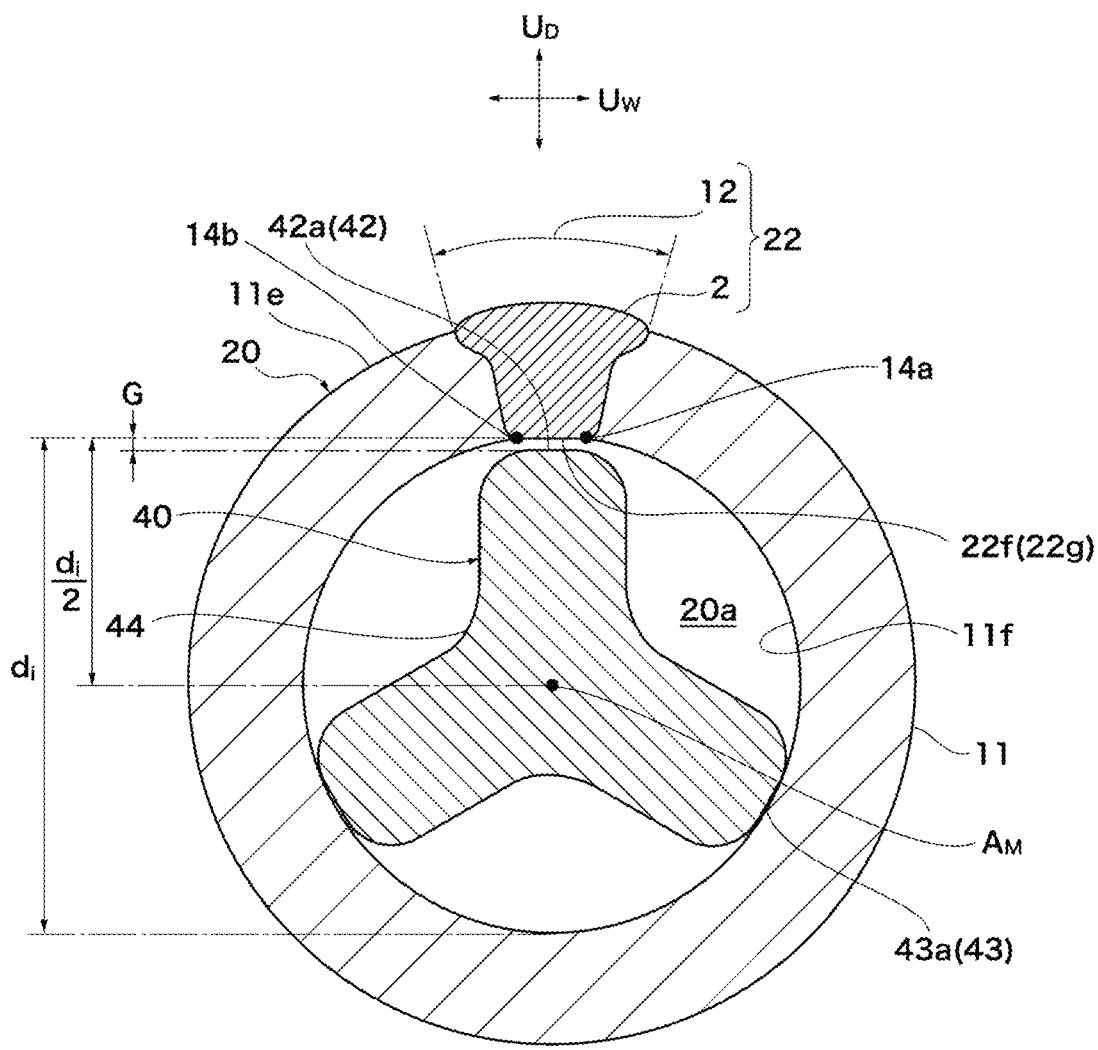
FIG. 21 is a schematic cross-sectional view for describing a third modification of the backing jig.

The backing jig 40 according to the present embodiment is a backing jig used in the method for producing the metal cylinder material according to the present embodiment, as shown in FIGS. 19 to 21, the jig is installable in the inside 20a of the filler-equipped circular cylinder-shaped body 20, and includes the backing portion 42 and the leg portion 43 located on the rear side of the front surface 42a of the backing portion 42, when installed in the inside 20a of the filler-equipped circular cylinder-shaped body 20, the front surface 42a of the backing portion 42 faces the inner surface 22f of the filling portion 22, the front surface 43a of the leg portion 43 is in contact with the inner surface 11f of the circular cylinder barrel portion 11, in a state where the backing jig 40 is installed in the inside 20a of the filler-equipped circular cylinder-shaped body 20, a minimum distance G (unit: mm) between the temporary line 22g connecting straight both ends 14a and 14b of the slit 12 on the inner surface 11f side of the circular cylinder barrel portion 11, appearing in the cross section shown in FIGS. 19 to 21 perpendicularly crossing the axis $A_M$ of the filler-equipped circular cylinder-shaped body 20, and the front surface 42a of the backing portion 42 satisfies Formula 1.

$$0 \leq G \leq 0.1 d_i \quad \text{[Formula 1]}$$

In the formula, $d_i$ indicates the inside diameter (unit: mm) of the filler-equipped circular cylinder-shaped body 20. The case where the filler-equipped cylinder-shaped body is a filler-equipped circular cylinder-shaped body has been described above, but when the filler-equipped cylinder-shaped body is a filler-equipped elliptical cylinder-shaped body, when the inside diameter of the short axis direction of the filler-equipped elliptical cylinder-shaped body is $d_i$ (unit: mm), Formula 1 is satisfied.

The installation means that the backing jig 40 is inserted into the inside 20a of the filler-equipped circular cylinder-shaped body 20 with the backing portion 42 below the filling portion 22. Note that for the backing jig 40 of a columnar body as shown in FIG. 3, there is no need to align the backing portion 42, and at the time of insertion, the backing portion 42 exists below the filling portion 22.

The backing portion 42 includes the front surface 42a that is an inner bottom of the slit 12 that prevents the filler 2 from reaching the inside 20a of the filler-equipped circular cylinder-shaped body 20, or a support surface that receives force caused by pressing. The leg portion 43 includes the front surface 43a that is in contact with the inner surface 11f of the circular cylinder barrel portion 11. The front surface 42a may be a flat surface, but is preferably a curved surface that matches the curvature of the inner surface 11f or a curved surface that has a curvature smaller than the curvature of the inner surface 11f. The front surface 43a may be a flat or angled surface, but is preferably a curved surface that matches or is smaller than the curvature of the inner surface 11f. If there are a plurality of metal plate materials, the front surface 43a may be in contact with the inner surface 11f across the filling portion 22 (not shown). When the front surface 43a is in contact with the inner surface 11f, there is a space G between the front surface 42a and the temporary line 22g.

In Formula 1, when G=0, the front surface 42a comes in contact with the inner surface 11f across the filling portion 22. If $G > 0.1 d_i$, the front surface 42a no longer function as the inner bottom of the slit 12 and no longer function as the support surface that receives force. When the length of the filler-equipped circular cylinder-shaped body 20 is $L_{20}$, as $L_{20}$ increases, the influence of warpage of the filler-equipped circular cylinder-shaped body 20 increases, and it will be difficult to insert and install the backing jig 40 into the inside 20a. Considering this warpage, the preferred range of the shortest distance G is $(10d_1+L_{20})/1000 \leq G \leq 0.09 d_i$, and more preferably $(10d_1+L_{20})/1000 \leq G \leq 0.08 d_i$.

FIG. 19 is a schematic cross-sectional view with the backing jig 40 shown in FIG. 4 replaced by the backing jig in the third form of the method for producing the metal cylinder material. FIG. 20 is a schematic cross-sectional view with the backing jig 40 shown in FIG. 4 replaced by the backing jig in the fourth form of the method for producing the metal cylinder material. When the backing jig 40 with the shape shown in FIG. 19 or 20 is installed across the length direction $U_H$ of the circular cylinder barrel portion 11, the leg portion 43 is located directly behind the front surface 42a.

FIG. 21 is a schematic cross-sectional view with the backing jig 40 shown in FIG. 4 replaced by the backing jig in the fifth form of the method for producing the metal cylinder material. When the backing jig 40 with the shape shown in FIG. 21 is installed across the length direction $U_H$ of the circular cylinder barrel portion 11, a support portion 44 is located rearward of the front surface 42a. The support portion 44 branches rearward, with the leg portion 43 located at the branched end. Therefore, the leg portion 43 exists rearward of the front surface 42a.

As an example of the method for installing the backing jig 40, in starting the process B, the method for installing the backing jig 40 in the inside 10a of the slitted circular cylinder-shaped body 10 will be described. The backing jig 40 is inserted into the inside 10a of the slitted circular cylinder-shaped body 10 with the front surface 42a across the slit 12, and the backing jig 40 is installed in the inside 10a. After the installation, as shown in FIGS. 19 to 21, the slit 12 is filled with the filler 2, and the filler-equipped circular cylinder-shaped body 20 is formed with the backing jig 40 installed in the inside 20a of the filler-equipped circular cylinder-shaped body 20. In starting the process C, the same is true for the method for installing the backing jig 40 in the inside 20a of the filler-equipped circular cylinder-shaped body 20.

[Sixth to Eighth Forms]

Sixth to eighth forms of the method for producing a metal cylinder material will be described in detail, focusing on differences from the first form. The sixth to eighth forms are forms of adopting a backing jig using a variable mechanism.

The backing jig 40 according to the present embodiment is a backing jig used in the method for producing the metal cylinder material according to the present embodiment, and as shown in FIGS. 22 to 27, includes the backing portion 42, the leg portion 43 located on the rear side of the front surface 42a of the backing portion 42, and the variable mechanism 45 that varies the length between the front surface 42a of the backing portion 42 and the front surface 43a of the leg portion 43.

Figure 22:
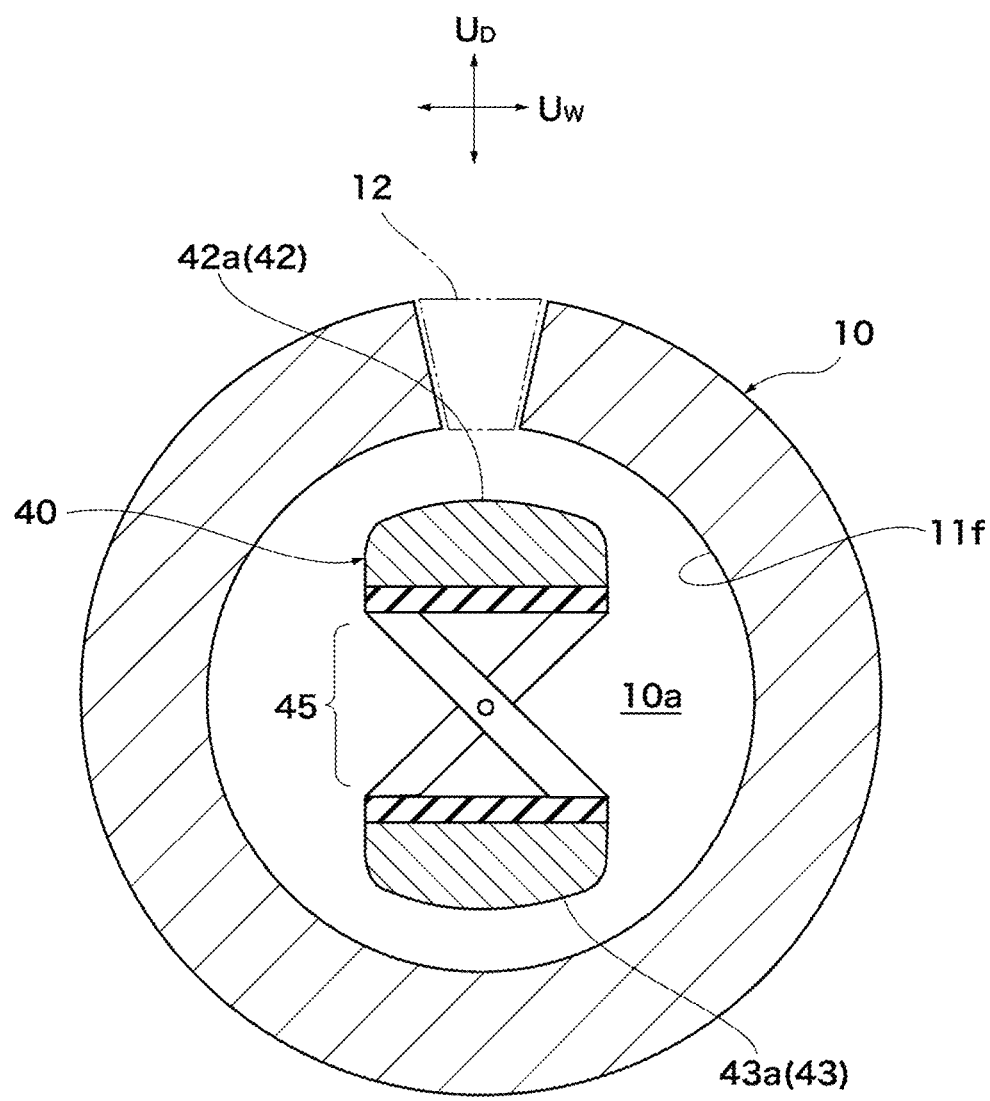
FIG. 22 is a schematic cross-sectional view for describing a fourth modification of the backing jig before filling with a filler.
Figure 23:
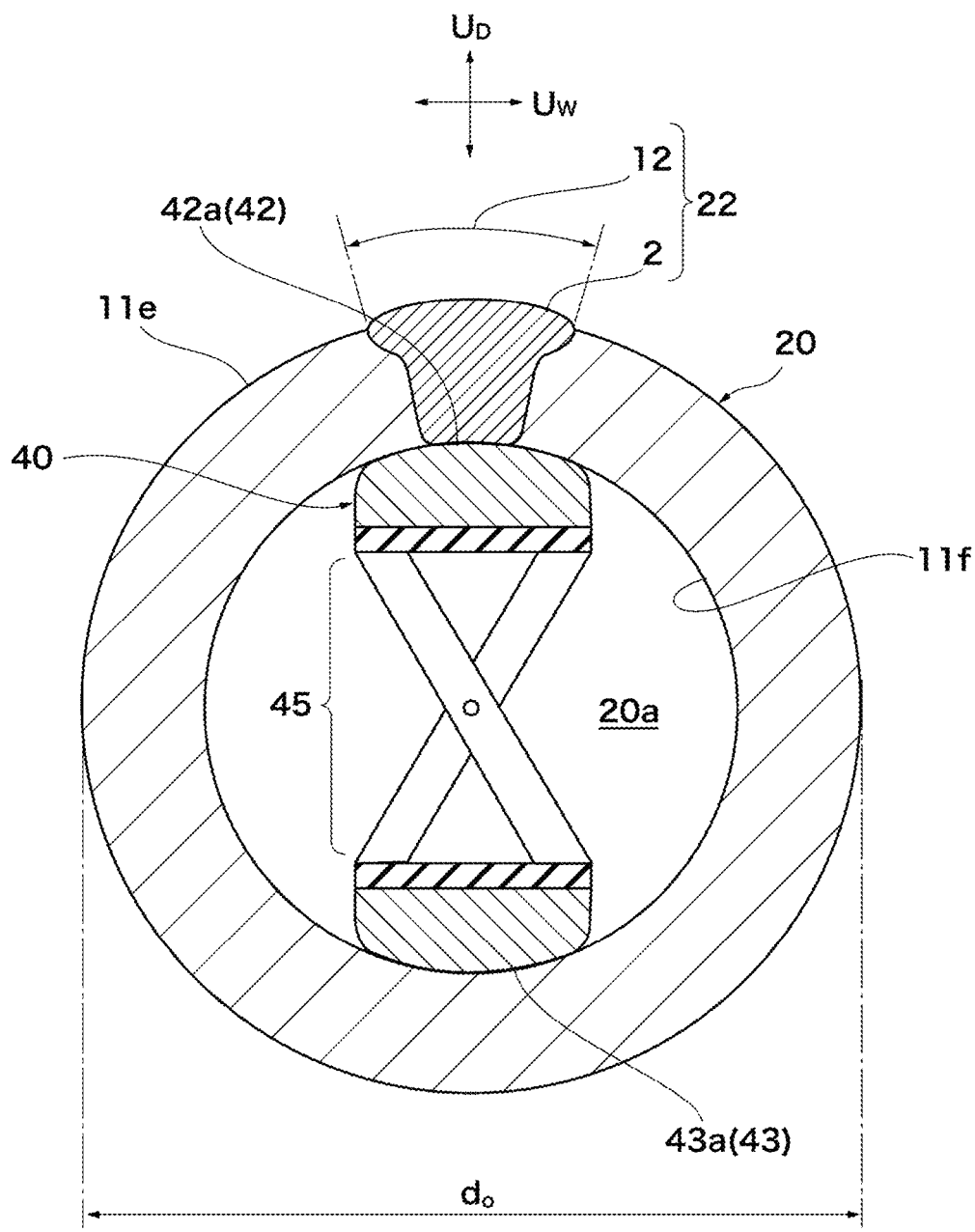
FIG. 23 is a schematic cross-sectional view for describing the fourth modification of the backing jig after filling with the filler.

The sixth form will be described. The sixth form is shown in FIGS. 22 and 23. The backing jig 40 shown in FIGS. 22 and 23 is a backing jig in which the variable mechanism 45 replaces the support portion 44 in the backing jig 40 shown in FIG. 19 or FIG. 20. The variable mechanism 45 is a jack-type variable mechanism.

As an example of the method for installing the backing jig 40, in starting the process B, the method for installing the backing jig 40 in the inside 10a of the slitted circular cylinder-shaped body 10 will be described. As shown in FIG. 22, the jack-type variable mechanism 45 is shrunk and the backing jig 40 is inserted into the inside 10a of the slitted circular cylinder-shaped body 10. After the insertion, the front surface 42a is brought into contact with the inner surface 11f with the front surface 42a across the slit 12, the jack-type variable mechanism 45 is extended, and the backing jig 40 is installed in the inside 10a with the front surface 43a in contact with the inner surface 11f. After the installation, as shown in FIG. 23, the slit 12 is filled with the filler 2 to form the filler-equipped circular cylinder-shaped body 20. In starting the process C, the same is true for the method for installing the backing jig 40 in the inside 20a of the filler-equipped circular cylinder-shaped body 20. As the backing jig 40, other forms of filler-equipped circular cylinder-shaped body with different inside diameter (not shown) can also be used by the jack-type variable mechanism 45.

Figure 24:
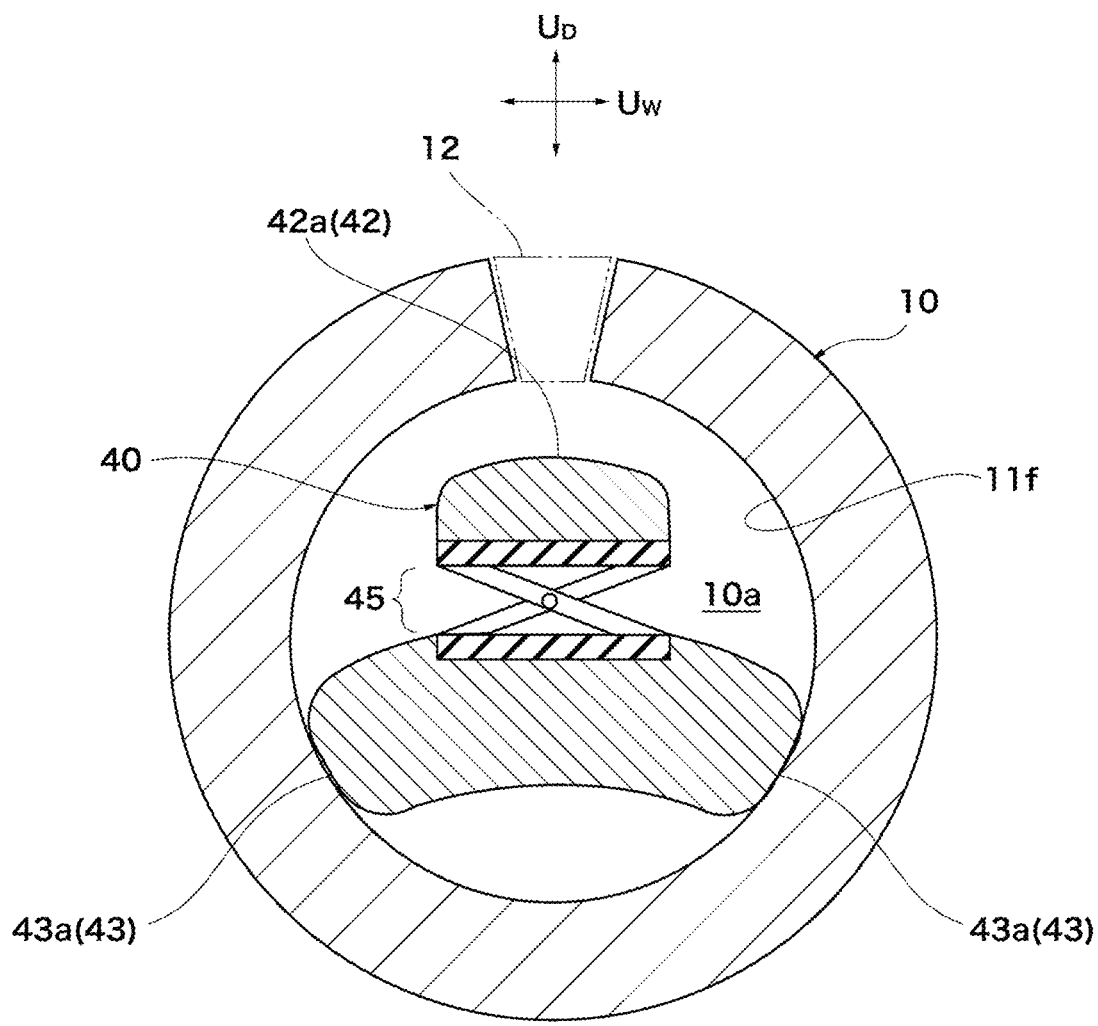
FIG. 24 is a schematic cross-sectional view for describing a fifth modification of the backing jig before filling with the filler.
Figure 25:
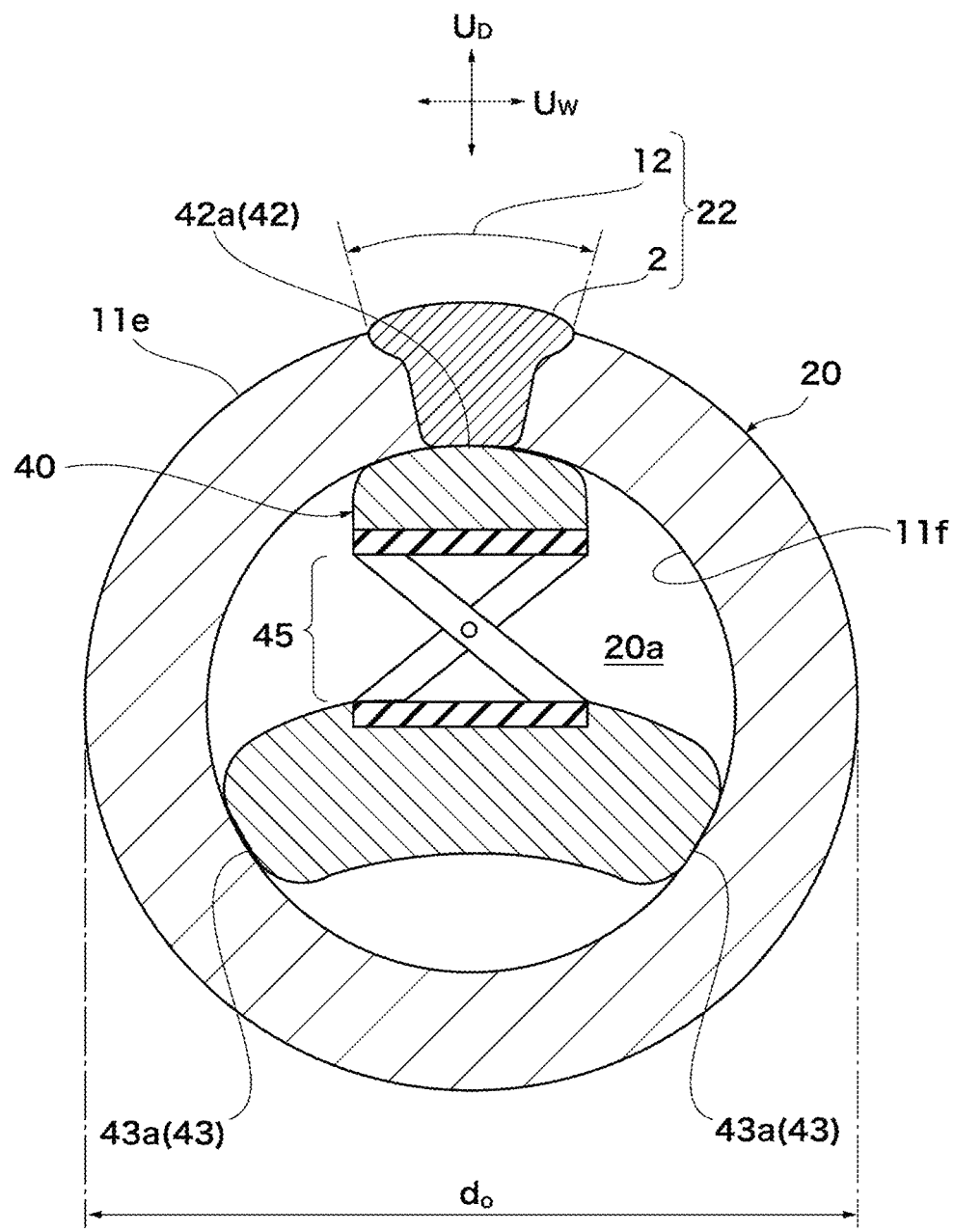
FIG. 25 is a schematic cross-sectional view for describing the fifth modification of the backing jig after filling with the filler.

The seventh form will be described. The seventh form is shown in FIGS. 24 and 25. The backing jig 40 shown in FIG. 24 is a backing jig in which the variable mechanism 45 replaces the support portion 44 in the backing jig 40 shown in FIG. 21. The method for installing the backing jig 40 is the same as in the sixth form.

Figure 26:
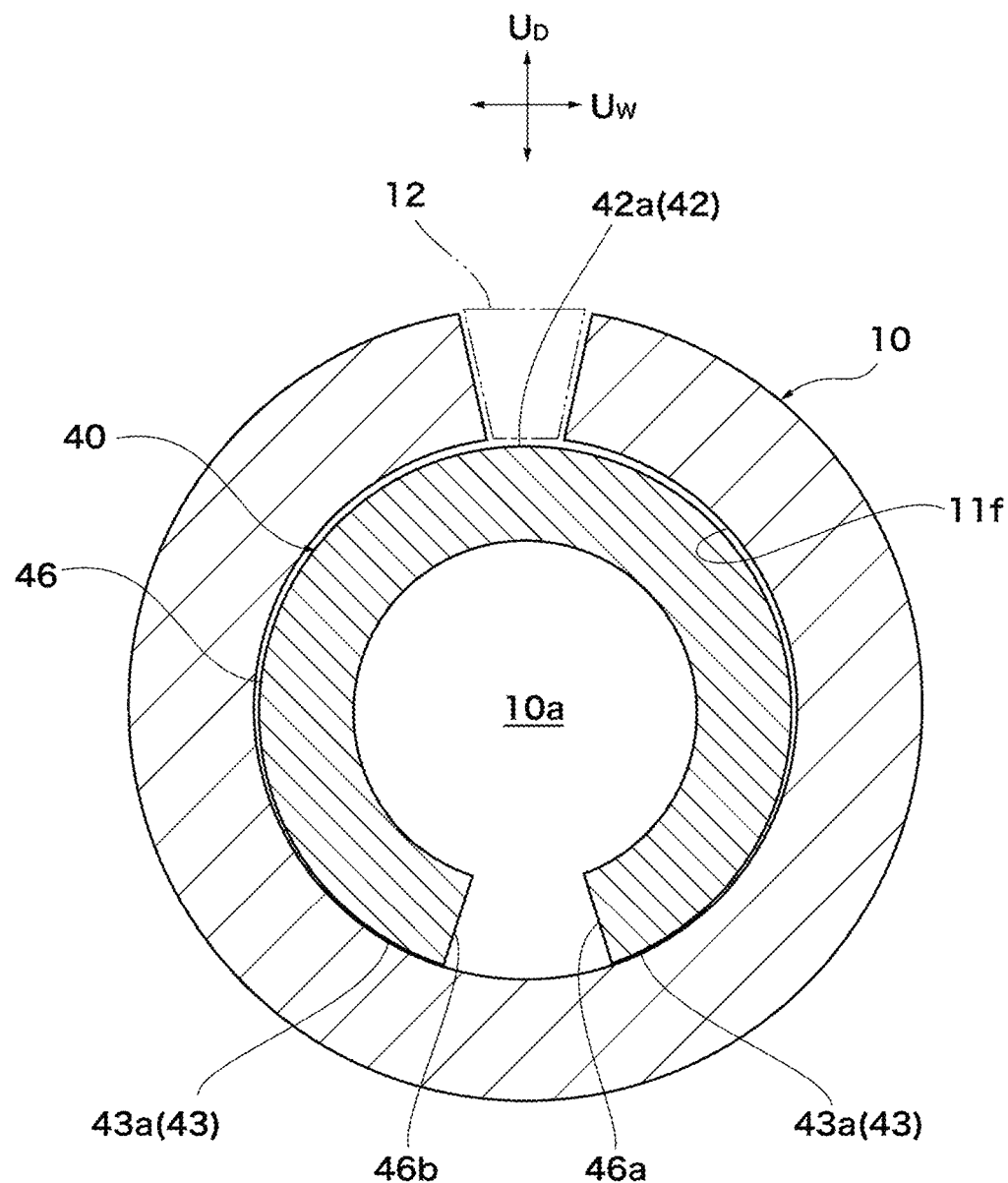
FIG. 26 is a schematic cross-sectional view for describing a sixth modification of the backing jig before filling with the filler.
Figure 27:
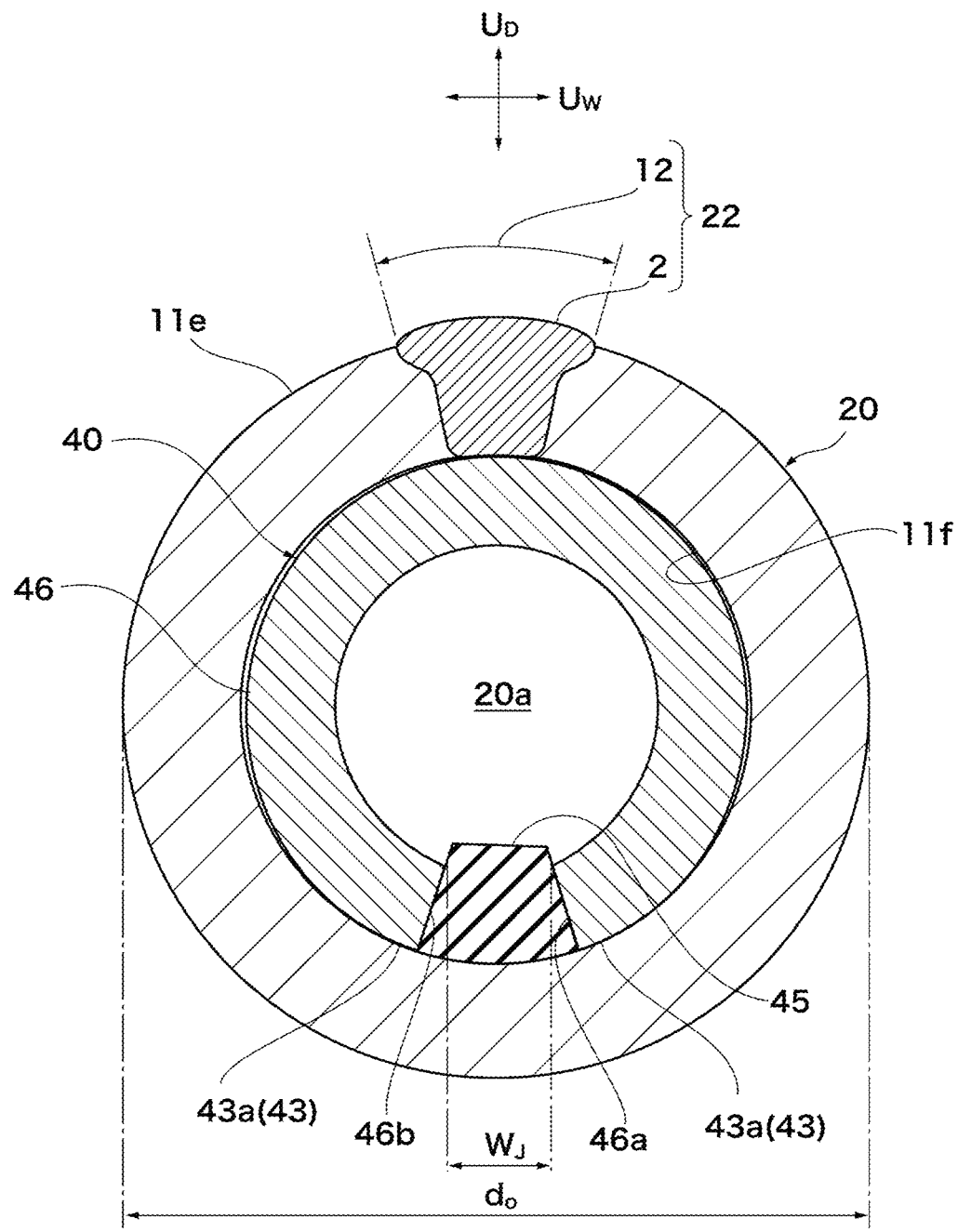
FIG. 27 is a schematic cross-sectional view for describing the sixth modification of the backing jig after filling with the filler.

The eighth form will be described. The eighth form is shown in FIGS. 26 and 27. The backing jig 40 shown in FIG. 27 is a combination of a rounded plate material 46 and the wedge-type variable mechanism 45 sandwiched between an end face 46a and an end face 46b of the plate material 46. The leg portion 43 is an end along the end face 46a and the end face 46b in the rounded plate material 46. The backing portion 42 is intermediate between the leg portions 43 in the rounded plate material 46. In FIG. 27, the wedge-type variable mechanism 45 is disposed at a position opposite the slit 12, but the wedge-type variable mechanism 45 may be rotated and disposed at a displaced position. The backing portion 42 includes the front surface 42a. The front surface 42a is an inner bottom of the slit 12 or a support surface that receives force caused by pressure. The leg portion 43 includes the front surface 43a that can be in contact with the inner surface 11f. The front surface 42a and the front surface 43a constitute part of the outer circumferential surface of the rounded plate material 46.

As an example of the method for installing the backing jig 40, in starting the process B, the method for installing the backing jig 40 in the inside 10a of the slitted circular cylinder-shaped body 10 will be described. As shown in FIG. 26, while bended to shrink the space between the end face 46a and the end face 46b, the rounded plate material 46 is inserted into the inside 10a of the slitted circular cylinder-shaped body 10 such that the front surface 42a is located below the slit 12. After the rounded plate material 46 is inserted, the wedge-type variable mechanism 45 is further inserted between the end face 46a and the end face 46b while pushing the end face 46a and the end face 46b apart, the rounded plate material 46 is spread out and the front surface 42a is brought into contact with the inner surface 11f with the front surface 42a across the slit 12, and the backing jig 40 is installed in the inside 10a. After the installation, as shown in FIG. 27, the slit 12 is filled with the filler 2 to form the filler-equipped circular cylinder-shaped body 20. In starting the process C, the same is true for the method for installing the backing jig 40 in the inside 20a of the filler-equipped circular cylinder-shaped body 20. By changing the length $W_j$ of the width direction of the wedge-type variable mechanism 45, the force with which the front surface 42a presses against the inner surface 11f can be adjusted.

REFERENCE SIGNS LIST 1 metal plate material
2 filler
3 plastic area
4 plastic area
5 assumed outer circumferential surface
10 slitted circular cylinder-shaped body
10a inside of slitted circular cylinder-shaped body
11 circular cylinder barrel portion
11a first end face of metal plate material
11b second end face of metal plate material
11c one end face of circular cylinder barrel portion
11d the other end face of circular cylinder barrel portion
11e outer circumferential surface of circular cylinder barrel portion
11f inner surface of circular cylinder barrel portion slit
13a end of slit on inner surface side of circular cylinder barrel portion
13b end of slit on inner surface side of circular cylinder barrel portion
13c end of slit on outer circumferential surface side of circular cylinder barrel portion
13d end of slit on outer circumferential surface side of circular cylinder barrel portion
14a end of slit on inner surface side of circular cylinder barrel portion
14b end of slit on inner surface side of circular cylinder barrel portion
20 filler-equipped circular cylinder-shaped body
20a inside of filler-equipped circular cylinder-shaped body
22 filling portion
22f inner surface of filling portion
22g temporary line
23 gap
30 metal circular cylinder material
32 FSP portion
40 backing jig
42 backing portion
42a front surface of backing portion
43 leg portion
43a front surface of leg portion
44 support portion
45 variable mechanism
46 plate material
46a end face of plate material
46b end face of plate material
50 friction stir rotation tool including probe
51 trunk portion
52 shoulder portion
53 probe
54 traveling direction
55 rotational direction
60 table
70 friction stir rotation tool with no probe
72 shoulder portion
75 rotational direction
76 pressing direction
80 pressing jig
84 pressing force
90a inside of circular cylinder-shaped body
91 circular cylinder-shaped body
91a one end face of metal plate material
91b the other end face of metal plate material
91c one end face of circular cylinder-shaped body
91d the other end face of circular cylinder-shaped body
92 discontinuous portion
101, 201, 301 metal plate material
112, 212, 312 slit
122, 222, 322 filling portion
102 welding material
202 block material
302 wire
402 granule
530 metal circular cylinder material
531 circular cylinder barrel portion
532 FSP portion

The invention claimed is:

1. A method for producing a metal cylinder material, the method comprising:
   a process A of forming a slitted cylinder-shaped body including at least one slit extending from one end face to the other end face of a cylinder barrel portion consisting of at least one metal plate material;
   a process B of forming a filler-equipped cylinder-shaped body including a filling portion obtained by filling the slit with a filler for the filler to be filled throughout the slit in a length direction of the slit; and
   a process C of, by inserting at least a probe of a friction stir rotation tool including the probe into at least the filling portion and executing friction stir processing (FSP), reforming at least the filling portion of the filler-equipped cylinder-shaped body to obtain the metal cylinder material including an FSP portion, wherein the friction stir rotation tool further includes a shoulder portion, and
   the reforming in the process C includes, when moving the friction stir rotation tool in one direction along the length direction of the slit while rotating, forming a plastic area protruding, from a filling portion around the shoulder portion and the probe, of the filling portion, over both sides of the metal plate material sandwiching the filling portion, applying shearing force in a rotational direction of the friction stir rotation tool to a plastic fluid in the plastic area to remove a defect and a void included in the plastic fluid, and furthermore, after the friction stir rotation tool has passed, obtaining the solid FSP portion by the plastic fluid being cooled and solidified.

2. The method for producing the metal cylinder material according to claim 1, wherein the slitted cylinder-shaped body has a shape of one metal plate material rounded into a cylinder shape, with the slit being a gap between the end faces, opposite to each other with a space, of the metal plate material, or has a shape of one cylinder shape formed by combining two or more metal plate materials, with the slit being a gap between the end faces, opposite to each other with a space, of adjacent metal plate materials of the metal plate materials.

3. The method for producing the metal cylinder material according to claim 1, wherein the slitted cylinder-shaped body is a slitted circular cylinder-shaped body, and a width of the slit is 0.2 mm or more and less than $0.4 \times (2d_o-1)^{1/2}$ mm (note that $d_o$ indicates an outside diameter (unit: mm) of the slitted circular cylinder-shaped body), or the slitted cylinder-shaped body is a slitted elliptical cylinder-shaped body, and a width of the slit is 0.2 mm or more and less than $0.4 \times (2d_o-1)^{1/2}$ mm (note that $d_o$ indicates an outside diameter (unit: mm) in a short axis direction of the slitted elliptical cylinder-shaped body).

4. The method for producing the metal cylinder material according to claim 1, wherein the process B is either one of
   a process B1 of overlaying the filler in the slit by an MIG or TIG method,
   a process B2 of pouring a molten body into the slit,
   a process B3 of fitting a block material having a thickness equal to or greater than a wall thickness of the metal plate material into the slit, and pressing with a friction stir rotation tool with no probe, or
   a process B4 of installing at least one of a wire, a granule, and powder in the slit, and pressing with a hammer, a press, or a friction stir rotation tool with no probe.

5. The method for producing the metal cylinder material according to claim 1, wherein a thickness of the filler is thicker than the wall thickness of the metal plate material.

6. The method for producing the metal cylinder material according to claim 4, wherein in the process B1 or the process B2, a backing jig including a backing portion is installed in an inside of the slitted cylinder-shaped body.

7. The method for producing the metal cylinder material according to claim 4, wherein in the process B3, a backing jig including a backing portion is installed in an inside of the slitted cylinder-shaped body, the slitted cylinder-shaped body is gripped, the slitted cylinder-shaped body is pressed from an outer circumferential surface side toward the backing portion by the friction stir rotation tool with no probe, or in the process B4, a backing jig including a backing portion is installed in an inside of the slitted cylinder-shaped body, the slitted cylinder-shaped body is gripped, and the slitted cylinder-shaped body is pressed from an outer circumferential surface side toward the backing portion by the hammer, the press, or the friction stir rotation tool with no probe.

8. The method for producing the metal cylinder material according to claim 1, wherein in the process C, when the wall thickness of the metal plate material is $T_1$ (unit: mm), a probe length $Q_1$ (unit: mm) of the friction stir rotation tool satisfies $0<Q_1 \leq (T_1-0.5)$.

9. The method for producing the metal cylinder material according to claim 1, wherein in the process C, a backing jig including a backing portion is installed in an inside of the filler-equipped cylinder-shaped body, the filler-equipped cylinder-shaped body is gripped, the friction stir rotation tool is inserted into the filler-equipped cylinder-shaped body from an outer circumferential surface side toward the backing portion, and at least the filling portion of the filler-equipped cylinder-shaped body is reformed.

10. The method for producing the metal cylinder material according to claim 1, wherein a wall thickness $T_A$ of a place of the metal cylinder material other than the FSP portion is 2 mm or more and 25 mm or less, and a length $L_1$ of the metal cylinder material is 500 mm or more.

11. The method for producing the metal cylinder material according to claim 1, further comprising a process D of applying plastic working to at least the FSP portion of the metal cylinder material after the process C.

12. The method for producing the metal cylinder material according to claim 11, further comprising, between the process C and the process D, after the process D, or both between the process C and the process D and after the process D, a process E of performing heat treatment on the metal cylinder material at a temperature equal to or higher than a recrystallization temperature of the metal plate material.

13. The method for producing the metal cylinder material according to claim 1, wherein the metal cylinder material includes either one of Au, Ag, Al, Cu, Zn, Au-base alloy, Ag-base alloy, Al-base alloy, Cu-base alloy, or Zn-base alloy.

14. The method for producing the metal cylinder material according to claim 1, wherein the metal cylinder material is an entire or part of a sputtering target, a pressure vessel capsule, or a pressure vessel liner.

* * * * *